(12) United States Patent
Otake et al.

(10) Patent No.: US 8,093,627 B2
(45) Date of Patent: Jan. 10, 2012

(54) NITRIDE SEMICONDUCTOR DEVICE AND METHOD FOR PRODUCING NITRIDE SEMICONDUCTOR DEVICE

(75) Inventors: Hirotaka Otake, Kyoto (JP); Kentaro Chikamatsu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 194 days.

(21) Appl. No.: 12/344,351

(22) Filed: Dec. 26, 2008

(65) Prior Publication Data
US 2009/0179227 A1    Jul. 16, 2009

(30) Foreign Application Priority Data

Dec. 28, 2007  (JP) ................................. 2007-340214

(51) Int. Cl.
*H01L 29/205*  (2006.01)
*H01L 29/78*  (2006.01)
*H01L 21/336*  (2006.01)

(52) U.S. Cl. ............... 257/192; 257/288; 257/E29.255; 257/E29.091; 257/E21.441; 438/285

(58) Field of Classification Search .................. 257/192, 257/288, E29.255, E29.091, E21.441; 438/270
See application file for complete search history.

(56) References Cited

U.S. PATENT DOCUMENTS

| | | | |
|---|---|---|---|
| 2001/0040246 A1* | 11/2001 | Ishii | 257/192 |
| 2003/0082860 A1 | 5/2003 | Yoshida et al. | |
| 2007/0164306 A1* | 7/2007 | Nakahata et al. | 257/103 |
| 2008/0149965 A1* | 6/2008 | Kaibara et al. | 257/192 |

FOREIGN PATENT DOCUMENTS

JP   2003-163354   6/2003

* cited by examiner

*Primary Examiner* — Victor A Mandala
*Assistant Examiner* — Whitney T Moore
(74) *Attorney, Agent, or Firm* — Rabin & Berdo, PC

(57) ABSTRACT

This nitride semiconductor device comprises: an n-type first layer made of a group III nitride semiconductor; a p-type second layer made of a group III nitride semiconductor layer provided on the first layer; and an n-type third layer made of a group III nitride semiconductor with a p-type impurity content of not more than $1 \times 10^{18}$ cm$^{-3}$ provided on the second layer.

8 Claims, 12 Drawing Sheets

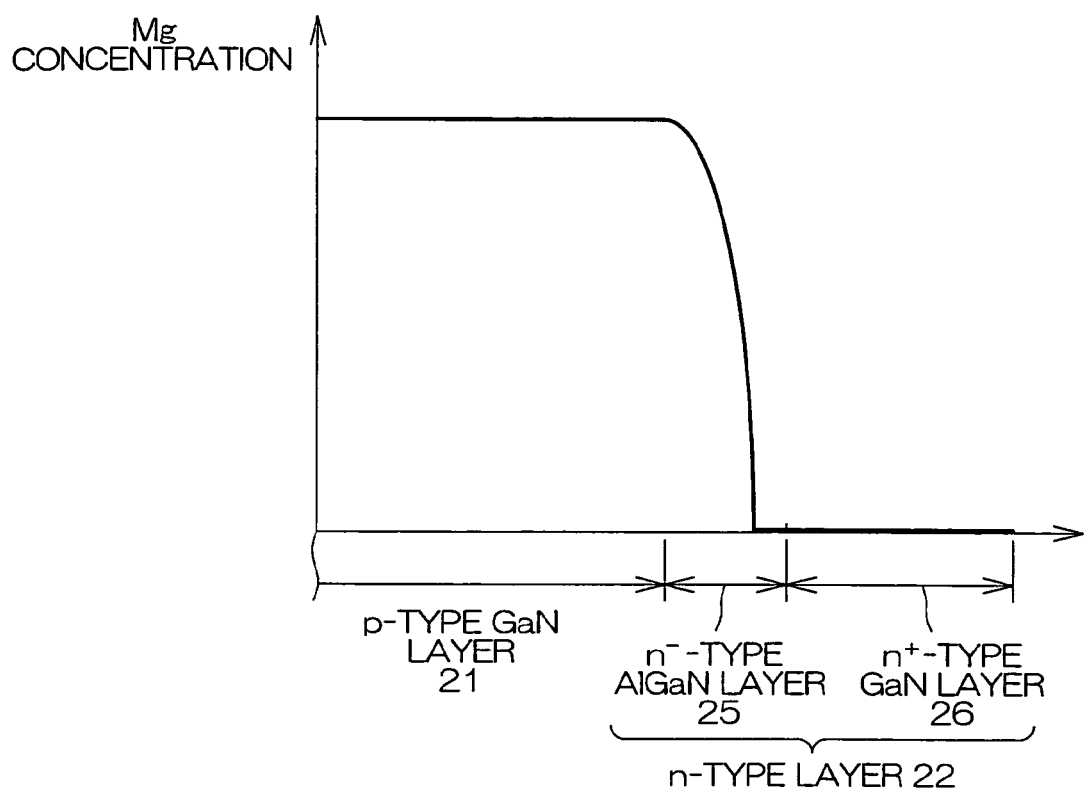

NITRIDE SEMICONDUCTOR DEVICE AND METHOD FOR PRODUCING NITRIDE SEMICONDUCTOR DEVICE

BACKGROUND OF THE INVENTION

1. Field of the Invention

The present invention relates to a nitride semiconductor device constituted of group III nitride semiconductors and a method for producing the same. The group III nitride semiconductors are semiconductors expressed in a general formula $Al_xIn_yGa_{1-x-y}N$ ($0 \leq x \leq 1$, $0 \leq y \leq 1$ and $0 \leq x+y \leq 1$).

2. Description of Related Art

Conventionally, a power device using a silicon semiconductor is employed for a power amplifier circuit, a power supply circuit, a motor driving circuit or the like.

However, improvement in withstand voltage, reduction in resistance and improvement in speed of a silicon devices are now reaching the limits due to the theoretical limit of the silicon semiconductor, and it is becoming difficult to satisfy requirements of the market.

Therefore, development of a nitride semiconductor device having characteristics such as a high with stand voltage, a high-temperature operation, a high current density, high-speed switching and small on-resistance is examined.

FIG. 8 is a schematic sectional view for illustrating the structure of a conventional nitride semiconductor device.

This nitride semiconductor device includes a sapphire substrate 81 and a multilayer structure portion 93 of an n-p-n structure formed by an undoped GaN layer 82, an n-type GaN layer 83, a p-type GaN layer 84 ad an n-type GaN layer 85 successively laminated on the sapphire substrate 81.

A mesa multilayer portion 92 having a mesa shape is formed in the multilayer structure portion 93 by etching the same from the surface of the n-type GaN layer 85 up to an intermediate portion of the n-type GaN layer 83. Both side surfaces of the mesa multilayer portion 92 are formed by inclined surfaces 91 inclined with respect to the laminating interfaces of the multilayer structure portion 93. A gate insulating film 86 made of $SiO_2$ (silicon oxide) is formed on the surface (including the inclined surfaces 91) of the multilayer structure portion 93.

Contact holes are formed in the gate insulating film 86 for partially exposing the n-type GaN layers 85 and 83 respectively. A source electrode 88 is formed on the portion of the n-type GaN layer 85 exposed from the corresponding contact hole, to be in ohmic contact with the n-type GaN layer 85. On the other hand, drain electrodes 89 are formed on the portions of the n-type GaN layer 83 exposed from the corresponding contact holes, to be in ohmic contact with the n-type GaN layer 83. Gate electrodes 87 are formed on portions of the gate insulating film 86 opposed to the inclined surfaces 91.

Interlayer dielectric films 90 made of polyimide are interposed between the adjacent ones of the source electrode 88, the drain electrodes 89 and the gate electrodes 87 respectively, thereby isolating these adjacent electrodes from one another.

The n-p-n structure of this vertical MOSFET is prepared by epitaxially growing the undoped GaN layer 82 on the substrate 81 and successively epitaxially growing the n-type GaN layer 83, the p-type GaN layer 84 and the n-type GaN layer 85 thereon by MOCVD (Metal Organic Chemical Vapor Deposition), for example. In the steps of forming the n-type GaN layers 83 and 85, source gas containing silicon as an n-type impurity is fed into a treating chamber along with gallium and nitrogen, for example, thereby growing GaN crystals containing silicon. In the step of forming the p-type GaN layer 84, on the other hand, source gas containing magnesium as a p-type impurity is fed into the treating chamber along with gallium and nitrogen, for example, thereby growing a GaN crystal containing magnesium.

When the n-type GaN layer 85 is crystal-grown on the p-type GaN layer 84, however, transistor characteristics may be deteriorated due to a large quantity of magnesium contained in the n-type GaN layer 85. More specifically, a large quantity of source gas containing a p-type impurity (magnesium, for example) remains in the treating chamber immediately after the p-type GaN layer 84 is crystal-grown therein. Therefore, the p-type impurity remaining in the atmosphere of the treating chamber is incorporated when the n-type GaN layer 85 is thereafter crystal-grown. Consequently, the n-type GaN layer 85 contains a large quantity of the p-type impurity, to have high resistance. Magnesium is generally employed as the p-type impurity, and hence the aforementioned phenomenon is referred to as "Mg memory effect".

In order to avoid this problem, the substrate 81 may be taken out from the treating chamber into the air atmosphere after the formation of the p-type GaN layer 84, and the n-type GaN layer 85 may be thereafter regrown in this treating chamber or another treating chamber. In this case, however, the substrate 81 must be cooled to room temperature in the treating chamber, before the same is taken out into the air atmosphere. In this cooling period, a large quantity of magnesium is introduced into the surface layer portion of the p-type GaN layer 84. Consequently, a large quantity of magnesium is introduced into the interface between the p-type GaN layer 84 and the n-type GaN layer 85 laminated thereon, and hence the peak of the Mg concentration appears in the vicinity of the interface. This region (particularly regions in the n-type semiconductor layers) having a high Mg concentration exhibits high electrical resistance, to disadvantageously increase the on-resistance of the transistor.

Further, the surface of the p-type GaN layer 84 taken out into the air atmosphere is oxidized, and hence it is difficult to improve the quality of the regrown n-type GaN layer 85.

SUMMARY OF THE INVENTION

An object of the present invention is to provide a nitride semiconductor device having a structure capable of effectively reducing resistance and a method for producing the same.

The foregoing and other objects, features and effects of the present invention will become more apparent from the following detailed description of the embodiments with reference to the attached drawings.

BRIEF DESCRIPTION OF THE DRAWINGS

FIG. 7 illustrates the concentration profile of Mg contained in a p-type GaN layer, an n-type AlGaN layer and an n$^+$-type GaN layer shown in FIG. 5.

DETAILED DESCRIPTION OF THE INVENTION

Figure 1:
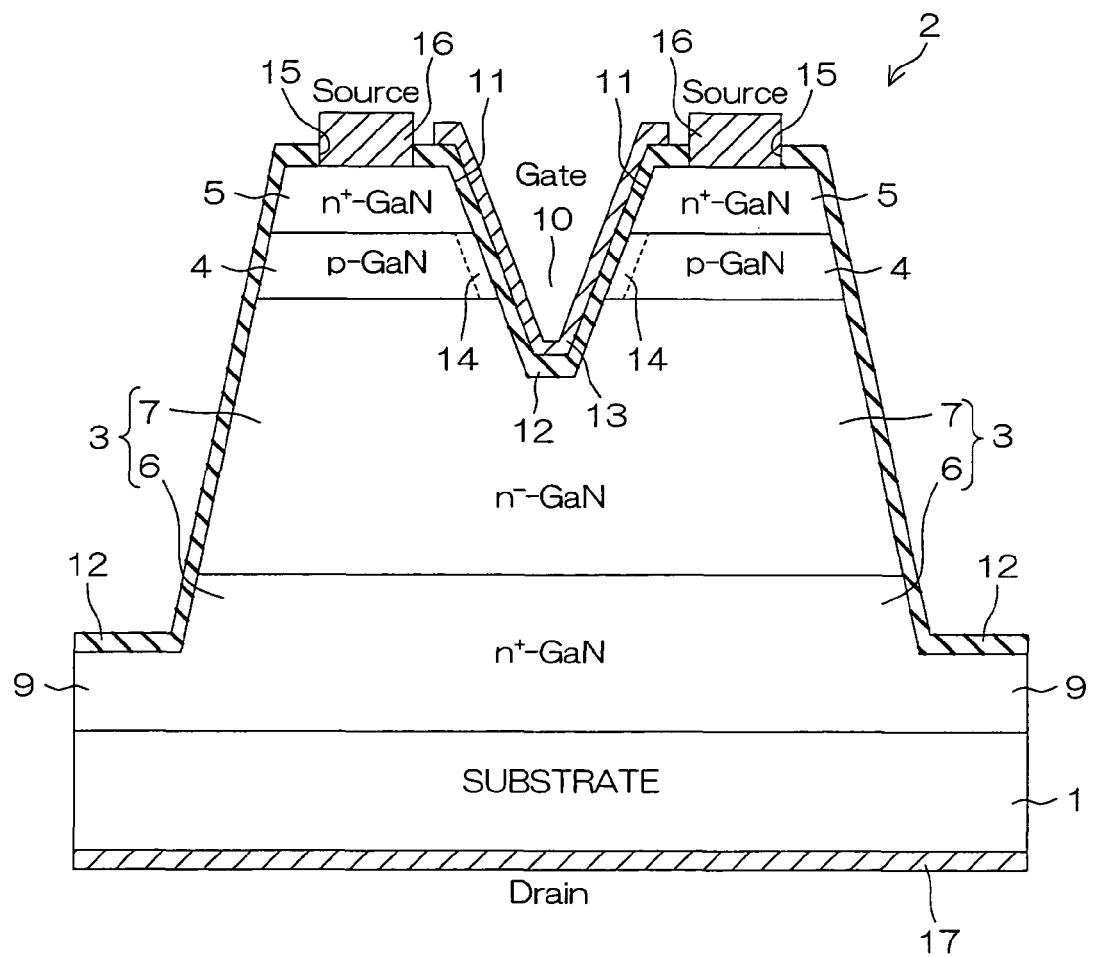
FIG. 1 is a schematic sectional view for illustrating the structure of a nitride semiconductor device according to a first embodiment of the present invention.

A nitride semiconductor device according to one embodiment of the present invention includes an n-type first layer made of a group III nitride semiconductor, a p-type second layer made of a group III nitride semiconductor layer provided on the first layer, and an n-type third layer made of a group III nitride semiconductor with a p-type impurity content (concentration) of not more than $1 \times 10^{18}$ cm$^{-3}$ (more preferably, not more than $1 \times 10^{16}$ cm$^{-3}$) provided on the second layer.

According to this structure, the first, second and third layers form a vertical n-p-n structure. The p-type impurity content (concentration) in the n-type third layer is not more than $1 \times 10^{18}$ cm$^{-3}$. Thus, the resistance of the device can be effectively reduced.

Preferably, a group III nitride semiconductor multilayer structure including the first layer, the second layer and the third layer has a wall surface extending over the first layer, the second layer and the third layer, and the nitride semiconductor device further includes a gate insulating film formed such that the gate insulating film is opposed to the wall surface, a gate electrode formed such that the gate electrode is opposed to the second layer through the gate insulating film, a drain electrode formed such that the drain electrode is in ohmic contact with the first layer, and a source electrode formed such that the source electrode is in ohmic contact with the third layer.

According to this structure, the wall surface extending over the first, second and third layers is formed on the group III nitride semiconductor structure including the first to third layers, the gate insulating film is formed such that the gate insulating film is opposed to the wall surface, and the gate electrode is opposed to the second layer through the gate insulating film. On the other hand, the drain electrode and the source electrode are in ohmic contact with the drain electrode and the source electrode respectively. Thus, a transistor of an MIS (Metal Insulator Semiconductor) structure is formed. In other words, a channel (inversion layer) can be formed or vanished in a portion of the second layer close to the wall surface by varying a control voltage supplied to the gate electrode while supplying a voltage between the source and the drain. Thus, a transistor operation is enabled. In this case, the p-type impurity content (concentration) in the n-type third layer is so set to not more than $1 \times 10^{18}$ cm$^{-3}$ that impurity scattering of electrons can be reduced, whereby a low-resistance transistor device can be implemented.

Preferably, the nitride semiconductor device further includes a channel layer, different in conductivity from the second layer, formed on a semiconductor surface portion of the second layer on the wall surface, and the gate insulating film is interposed between the channel layer and the gate electrode.

According to this structure, a channel is formed on the channel layer different in conductivity from the second layer. When an acceptor concentration in the channel layer is lower than that in the second layer, therefore, a gate threshold voltage can be reduced and electron mobility can be improved as compared with a case where the channel is formed on the second layer. Consequently, the on-resistance can be so reduced as to implement a power device having excellent characteristics.

The channel layer may be formed by converting the second layer, or may be formed by regrowing the group III nitride semiconductor from the second layer.

Preferably, the nitride semiconductor device further includes a fourth layer formed by a group III nitride semiconductor layer interposed between the second layer and the third layer for preventing introduction of a p-type impurity from the second layer into the third layer.

According to this structure, the fourth layer interposed between the second and third layers prevents introduction (diffusion) of the p-type impurity from the second layer into the third layer resulting from a subsequent heating process or the like. Consequently, the p-type impurity content (concentration) in the third layer can be further reduced, whereby the resistance of the device can be more effectively reduced.

Preferably, the fourth layer is made of AlGaN or AlN.

The p-type impurity is hardly introduced into AlGaN or AlN, and hence introduction (diffusion) of the p-type impurity from the second layer into the third layer can be effectively prevented by preparing the fourth layer from this group III nitride semiconductor material. For example, the p-type impurity concentration in the third layer can be reduced to not more than $1 \times 10^{16}$ cm$^{-3}$.

A method for producing a nitride semiconductor device according to one embodiment of the present invention includes a first layer forming step of forming an n-type first layer made of a group III nitride semiconductor in a treating chamber, a second layer forming step of forming a p-type second layer made of a group III nitride semiconductor on the first layer in the treating chamber, and a third layer forming step of forming an n-type third layer made of a group III nitride semiconductor with a p-type impurity content (concentration) of not more than $1 \times 10^{18}$ cm$^{-3}$ (more preferably, not more than $1 \times 10^{16}$ cm$^{-3}$) on the second layer in the treating chamber, while the first layer, the second layer and the third layer are formed without being taken out from the treating chamber into the air atmosphere at all in the course of the formation.

According to this method, the n-type first layer, the p-type second layer and the n-type third layer are formed without being taken out from the treating chamber into the air atmosphere at all in the course of the formation but formed in the same treating chamber. Therefore, no high-concentration p-type impurity region is formed on the interface between the second and third layers. The p-type impurity content (concentration) in the third layer is suppressed to not more than $1 \times 10^{18}$ cm$^{-3}$, whereby a nitride semiconductor device having low resistance can be produced.

The first to third layers are not taken out from the treating chamber into the air atmosphere in the course of the formation but formed in the same treating chamber, whereby the surface of the p-type second layer can be prevented from oxidation. Consequently, the crystal quality of the n-type third layer formed on the second layer can be improved. Thus, a high-performance nitride semiconductor device can be prepared.

Preferably, the method for producing a nitride semiconductor device further includes a growth interruption step of not less than one minute after the second layer forming step and before the third layer forming step.

According to this method, the growth interruption step of not less than one minute is provided before the formation of the third layer, so that the p-type impurity concentration in the treating chamber can be reduced by exhausting the treating chamber in this period. The third layer is formed in this state, whereby the p-type impurity content (concentration) in the third layer can be reduced to not more than $1\times10^{18}$ cm$^{-3}$.

Preferably, the third layer forming step includes a step of growing the third layer at a growth rate for setting the p-type impurity content (concentration) in the third layer to not more than $1\times10^{18}$ cm$^{-3}$. For example, the growth rate for the third layer is rendered larger than that for the first layer.

According to this method, the content (concentration) of the p-type impurity introduced into the third layer from the atmosphere in the treating chamber can be reduced to not more than $1\times10^{18}$ cm$^{-3}$ by sufficiently increasing the growth rate for the third layer.

More preferably, the growth interruption step of not less than one minute is carried out after the second layer forming step and before the third layer forming step, and the third layer is thereafter grown at the growth rate for setting the p-type impurity content (concentration) in the third layer to not more than $1\times10^{18}$ cm$^{-3}$, in particular.

Preferably, the method for producing a nitride semiconductor device further includes a wall surface forming step of forming a wall surface extending over the first layer, the second layer and the third layer on a group III nitride semiconductor multilayer structure including the first layer, the second layer and the third layer, a gate insulating film forming step of forming a gate insulating film to be opposed to the wall surface, a gate electrode forming step of forming a gate electrode to be opposed to the second layer through the gate insulating film, a step of forming a drain electrode to be in ohmic contact with the first layer, and a step of forming a source electrode to be in ohmic contact with the third layer.

According to this method, the wall surface extending over the first, second and third layers is formed on the group III nitride semiconductor multilayer structure, the gate insulating film is formed to be opposed to the wall surface, and the gate electrode is formed thereon to be opposed to the second layer. Thus, an MIS structure is formed. Further, the drain electrode is formed to be in ohmic contact with the first layer and the source electrode is formed to be in ohmic contact with the third layer, thereby preparing a transistor made of group III nitride semiconductors. The resistance of the third layer is so suppressed that the resistance of the device is reduced and a large drain current can be ensured.

The method for producing a nitride semiconductor device may further include a channel layer forming step of forming a channel layer different in conductivity from the second layer on a semiconductor surface portion of the second layer exposed by the wall surface forming step, the gate insulating film forming step may be a step of forming the gate insulating film to be opposed to the channel layer, and the gate electrode forming step may be a step of forming the gate electrode to be opposed to the channel layer through the gate insulating film.

The channel layer forming step may include a step of forming the channel layer by converting the second layer, or may include a step of forming the channel layer by regrowing the group III nitride semiconductor from the second layer.

Preferably, the method for producing a nitride semiconductor device further includes a fourth layer forming step of forming a fourth layer made of a group III nitride semiconductor for preventing introduction of a p-type impurity from the second layer into the third layer on the second layer after the second layer forming step and before the third layer forming step. In this case, the third layer is formed on the fourth layer.

According to this method, the fourth layer is formed on the second layer, to prevent introduction (diffusion) of the p-type impurity from the second layer into the third layer resulting from a subsequent heating process or the like. Thus, the p-type impurity content (concentration) in the third layer can be more reliably reduced to not more than $1\times10^{18}$ cm$^{-3}$.

In the method for producing a nitride semiconductor device, the fourth layer is preferably made of AlGaN or AlN.

According to this method, AlGaN or AlN is so employed as the material for the fourth layer that introduction of the p-type impurity into the third layer can be more efficiently prevented. For example, the p-type impurity concentration in the third layer can be reduced to not more than $1\times10^{16}$ cm$^{-3}$.

Embodiments of the present invention are now described in more detail with reference to the attached drawings.

FIG. 1 is a schematic sectional view for illustrating the structure of a nitride semiconductor device according to a first embodiment of the present invention.

This nitride semiconductor device includes a substrate 1 and a nitride semiconductor multilayer structure portion 2 formed on one major surface of the substrate 1.

The substrate 1 is preferably formed by a conductive substrate such as a substrate (a GaN substrate or an AlN substrate, for example) made of a group III nitride semiconductor expressed in $Al_xIn_yGa_{1-x-y}N$ ($0 \leq x \leq 1$, $0 \leq y \leq 1$ and $0 \leq x+y \leq 1$), an SiC substrate or an Si substrate, for example. In other words, the type of the substrate 1 may be identical to or different from the nitride semiconductor multilayer structure portion 2. Further, the substrate 1 is not restricted to the conductive substrate, but may alternatively be formed by an insulating substrate such as a sapphire substrate.

The nitride semiconductor multilayer structure portion 2 includes an n-type layer 3, a p-type GaN layer 4 laminated on the n-type layer 3, and an n$^+$-type GaN layer 5 laminated on the p-type GaN layer 4.

The n-type layer 3 includes an n$^+$-type GaN layer 6 formed on one surface (upper surface) of the substrate 1 and an n$^-$-type GaN layer 7 laminated on the n$^+$-type GaN layer 6.

The n$^+$-type GaN layer 6 has an n-type impurity concentration of $1\times10^{18}$ cm$^{-3}$ to $5\times10^{18}$ cm$^{-3}$, for example, higher than that of the n$^-$-type GaN layer 7. The n$^+$-type GaN layer 6 is preferably thin, because the thickness of the n$^+$-type GaN layer 6 affects the etching depth and etching accuracy in the etching process after the preparation of the n$^+$-type GaN layer 6. For example, the thickness of the n$^+$-type GaN layer 6 is preferably not more than 1.0 μm, and it is more preferably not more than 0.5 μm. The thickness of the n$^+$-type GaN layer 6 is preferably not less than 0.1 μm so that the n$^+$-type GaN layer 6 can perform as the layer of n$^+$-type.

On the other hand, the n-type impurity concentration in the n$^-$-type GaN layer 7 is $1\times10^{16}$ cm$^{-3}$ to $1\times10^{18}$ cm$^{-3}$, for example (more specifically, $1\times10^{17}$ cm$^{-3}$, for example).

The p-type impurity concentration in the p-type GaN layer 4 is $1\times10^{18}$ cm$^{-3}$ to $5\times10^{19}$ cm$^3$, for example (more specifically, $4\times10^{19}$ cm$^{-3}$, for example).

The n-type impurity concentration in the n$^+$-type GaN layer 5 is $1\times10^{18}$ cm$^{-3}$ to $5\times10^{18}$ cm$^{-3}$, for example (more specifically, $3\times10^{18}$ cm$^{-3}$, for example). The n$^+$-type GaN layer 5 is grown in the same treating chamber after growth of the p-type GaN layer 4, and hence a p-type impurity in the atmosphere of the treating chamber is incorporated thereinto in the course of the growth. The p-type impurity concentration in the n$^+$-type GaN layer 5 resulting from the p-type impurity in this atmosphere is suppressed to not more than $1\times10^{18}$ cm$^{-3}$.

The nitride semiconductor multilayer structure portion 2 zonally extends in a direction perpendicular to the plane of FIG. 1, and is etched from the n$^+$-type GaN layer 5 up to a depth exposing the n$^+$-type GaN layer 6 in a direction across the laminating interfaces thereof, to have a generally trapezoidal section. The n$^+$-type GaN layer 6 has drawn portions 9 drawn from both sides of the nitride semiconductor multilayer structure portion 2 in a lateral direction (this direction is hereinafter referred to as "width direction") along the upper surface of the substrate 1. In other words, the drawn portions 9 are constituted of extensions of the n$^+$-type GaN layer 6 in this embodiment.

On the other hand, a trench 10 having a depth reaching an intermediate portion of the n-type GaN layer 7 from the n$^+$-type GaN layer 5 through the p-type GaN layer 4 is formed in the vicinity of a width-directional intermediate portion of the nitride semiconductor multilayer structure portion 2 along the longitudinal direction of the nitride semiconductor multilayer structure portion 2. According to this embodiment, the trench 10 has a generally V-shaped section, and inclined side surfaces thereof form wall surfaces 11 extending over the n$^-$-type GaN layer 7, the p-type GaN layer 4 and the n$^+$-type GaN layer 5.

In the p-type GaN layer 4, channel layers 14 are formed on semiconductor surface portions of regions around the wall surfaces 11. The channel layers 14 are made of a semiconductor different in conductivity from the p-type GaN layer 4, such as a p$^-$-type semiconductor having a lower acceptor concentration than the p-type GaN layer 4, for example. The thickness of the channel layers 14 (thickness in the directions orthogonal to the wall surfaces 11) is several nm to 100 nm, for example. The channel layers 14 may be made of the semiconductor different in conductivity from the p-type GaN layer 4, and the material therefor is not restricted to the p$^-$-type semiconductor, but may be any of an n-type semiconductor containing an n-type impurity, an i-type semiconductor hardly containing impurities and a semiconductor containing n-type and p-type impurities.

A gate insulating film 12 is formed to cover the overall regions of the wall surfaces 11 as well as the surfaces of the n$^+$-type GaN layer 6, the n$^-$-type GaN layer 7, the p-type GaN layer 4 and the n$^+$-type GaN layer 5. This gate insulating film 12 is opposed to the channel layers 14 in the regions of the wall surfaces 11, and further opposed to the p-type GaN layer 4 through the channel layers 14.

The n$^+$-type GaN layer 6, the n$^-$-type GaN layer 7, the p-type GaN layer 4 and the n$^+$-type GaN layer 5 are epitaxially grown on the substrate 1 by MOCVD (Metal Organic Chemical Vapor Deposition), for example.

When the major surface of the substrate 1 is defined by a c-plane (0001), for example, the n$^+$-type GaN layer 6, the n$^-$-type GaN layer 7, the p-type GaN layer 4 and the n$^+$-type GaN layer 5 are epitaxially grown on this substrate 1 also with major surfaces defined by c-planes (0001). The wall surfaces 11 of the nitride semiconductor multilayer structure portion 2 are oriented along planes (other than the c-planes) inclined in the range of 15° to 90° with respect to the c-planes (0001), for example. More specifically, the wall surfaces 11 are defined by nonpolar planes such as m-planes (10-10) or a-planes (11-20), or semipolar planes such as (10-13), (11-11) or (11-22), for example.

The gate insulating film 12 can be constituted of a nitride, an oxide, or the like. More specifically, the gate insulating film 12 can be constituted of SiN (silicon nitride), SiO$_2$ (silicon oxide) or a combination thereof. A gate electrode 13 is formed on the gate insulating film 12.

The gate electrode 13 is opposed to the wall surfaces 11, i.e., the n-type GaN layer 7, the p-type GaN layer 4 and the n$^+$-type GaN layer 5 through the gate insulating film 12, and formed to extend up to portions close to edge portions of the trench 10 on the upper surface of the n$^+$-type GaN layer 5. On the regions of the wall surfaces 11, the gate electrode 13 is opposed to the channel layers 14 through the gate insulating film 12, and further opposed to the p-type GaN layer 4 through the channel layers 14. The gate electrode 13 can be constituted of a conductive material such as an Ni/Au alloy consisting of Ni and Au laminated on this Ni, a Pd/Au alloy, a Pd/Ti/Au alloy, a Pd/Pt/Au alloy, Pt, Al, polysilicon, or the like. A proper bias is supplied to the gate electrode 13, to form channels electrically conducting the n-type layer 3 and the n$^+$-type GaN layer 5 in the channel layers 14.

Openings 15 partially exposing the upper surface of the n$^+$-type GaN layer 5 are formed in the gate insulating film 12. Source electrodes 16 are formed on portions of the n$^+$-type GaN layer 5 exposed from the openings 15.

The source electrodes 16, which are in ohmic contact with the n$^+$-type GaN layer 5, can be constituted of a metal such as a Ti/Al alloy consisting of Ti and Al laminated on this Ti, or the like. The source electrodes 16 are so constituted of the metal containing Al that the same can be excellently brought into ohmic contact with the n$^+$-type GaN layer 5. Alternatively, the source electrodes 16 may be constituted of Mo or an Mo compound (molybdenum silicide, for example), Ti or a Ti compound (titanium silicide for example), or W or a W compound (tungsten silicide, for example).

A drain electrode 17 is formed in contact with the other surface (lower surface) of the substrate 1. The drain electrode 17, which is in ohmic contact with the substrate 1, can be constituted of the same type of metal as the source electrodes 16, i.e., metal such as a Ti/Al alloy, or the like. Alternatively, the drain electrode 17 may be constituted of only Al, Mo or an Mo compound (molybdenum silicide, for example), Ti or a Ti compound (titanium silicide, for example), or W or a W compound (tungsten silicide, for example).

When the substrate 1 is formed by an insulating substrate such as a sapphire substrate, openings are formed in the gate insulating film 12 on the drawn portions 9, for example. The drain electrode 17 is formed to be in ohmic contact with the n$^+$-type GaN layer 6 through these openings.

When the substrate 1 is formed by a conductive substrate and the drain electrode 17 is formed in contact with the substrate 1, the n$^+$-type GaN layer 6 is not necessarily required, but the n$^-$-type GaN layer 7 may be formed on the surface of the substrate 1.

The operation of the aforementioned nitride semiconductor device is now described.

A bias positive on the side of the drain electrode 17 is supplied between the source electrodes 16 and the drain electrode 17. Thus, a reverse voltage is supplied to the p-n junction on the interface between the n$^-$-type GaN layer 7 and the p-type GaN layer 4, whereby the n$^+$-type GaN layer 5 and the n-type layer 3, i.e., the source electrodes 16 and the drain electrode 17 (the source and the drain) are cut off. When a bias exceeding a gate threshold voltage positive with reference to the potential of the source electrodes 16 is applied to the gate electrode 13 in this state, electrons are induced in portions of the channel layers 14 around the interfaces between the same and the gate insulating film 12, to form channels. The n-type layer 3 and the n$^+$-type GaN layer 5 conduct through these channels. Thus, the source and the drain conduct. In other words, the source and the drain conduct when a prescribed bias is supplied to the gate electrode 13, while the source and the drain are cut off when no bias is supplied to the gate electrode 13. Thus, a normally-off transistor operation is implemented.

The gate voltage (threshold voltage) necessary for forming the channels can be reduced due to the functions of the channel layers 14. Therefore, the gate threshold voltage can be reduced and electron mobility can be improved while keeping the acceptor concentration in the p-type GaN layer 4 high in order to cause no reach-through breakdown. Consequently, the on-resistance can be reduced, whereby a power device having excellent characteristics can be implemented.

Figure 2:
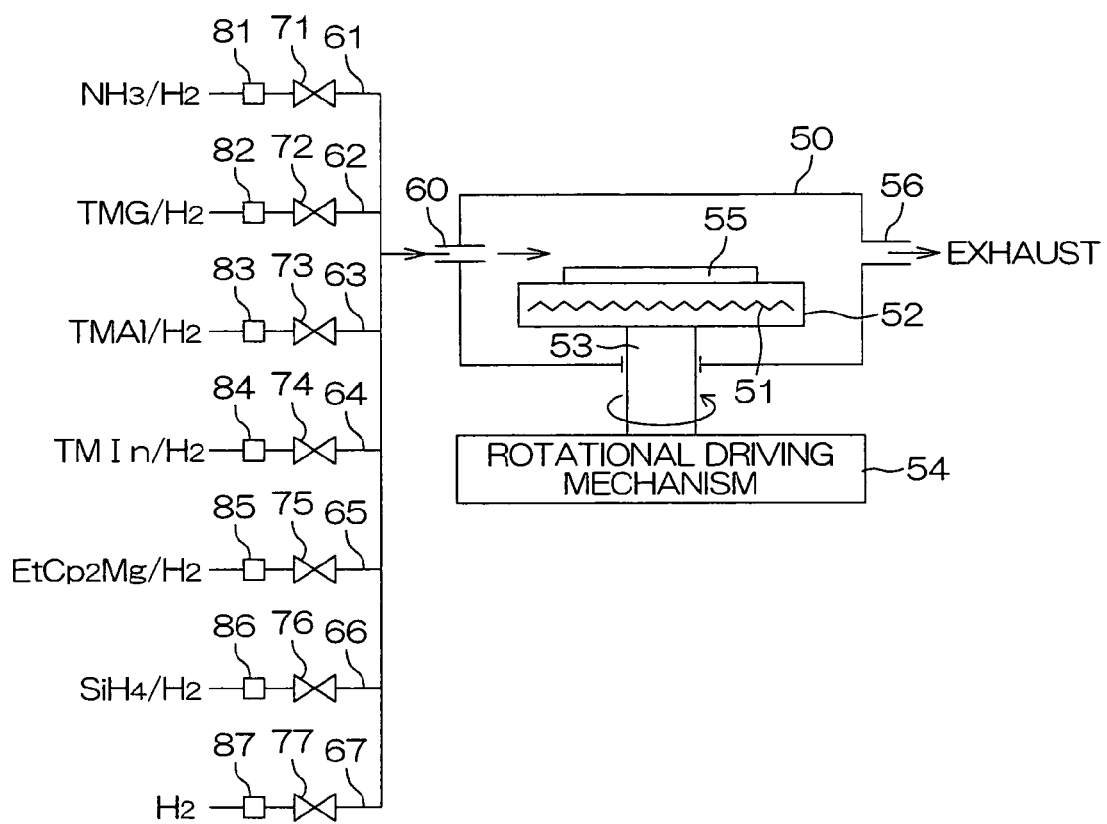
FIG. 2 is a diagram for illustrating the structure of a treating chamber for forming a nitride semiconductor multilayer structure portion.

FIG. 2 is a schematic diagram for illustrating the structure of a treating apparatus for crystal-growing the layers constituting the nitride semiconductor multilayer structure portion 2.

A susceptor 52 storing a heater 51 is arranged in a treating chamber 50. The susceptor 52 is coupled to a rotating shaft 53, which is rotated by a rotational driving mechanism 54 arranged outside the treating chamber 50. Thus, the susceptor 52 so holds a wafer 55 to be treated that the wafer 55 can be heated to a prescribed temperature and rotated in the treating chamber 50. The wafer 55 is a wafer constituting the aforementioned substrate 1.

An exhaust pipe 56 is connected to the treating chamber 50. The exhaust pipe 56 is connected to an exhaust unit such as a rotary pump. Thus, the treating chamber 50 is set to $\frac{1}{10}$ atm. to ordinary pressure (preferably about $\frac{1}{5}$ atm.), and regularly exhausted.

On the other hand, a source gas feed passage 60 for feeding source gas toward the surface of the wafer 55 held by the susceptor 52 is introduced into the treating chamber 50. A nitrogen material pipe 61 feeding ammonia as nitrogen source gas, a gallium material pipe 62 feeding trimethyl gallium (TMG) as gallium source gas, an aluminum material pipe 63 feeding trimethyl aluminum (TMAl) as aluminum source gas, an indium material pipe 64 feeding trimethyl indium (TMIn) as indium source gas, a magnesium material pipe 65 feeding ethylcyclopentadienyl magnesium, ($EtCp_2Mg$) as magnesium source gas, a silicon material pipe 66 feeding silane ($SiH_4$) as silicon source gas and a carrier gas feed pipe 67 feeding carrier gas (hydrogen and/or nitrogen, for example) are connected to the source gas feed passage 60. Valves 71 to 77 are interposed in these pipes 61 to 67 respectively. Each source gas is fed along with the carrier gas consisting of hydrogen and/or nitrogen.

Flow control devices 81 to 87 are interposed in the pipes 61 to 67 respectively. The composition ratios of nitride semiconductor crystals, the contents of n- and p-type impurities and the growth rates of the nitride semiconductor crystals can be controlled by controlling the flow rates of the source gasses with the flow control devices 81 to 87.

In order to epitaxially grow GaN on the wafer 55, the nitrogen material valve 71 and the gallium material valve 72 are opened. Thus, ammonia and trimethyl gallium are fed onto the wafer 55, whereby a GaN crystal is grown on the wafer 55. In order to control the conductivity type of this GaN crystal to an n-type, the silicon material valve 76 is further opened to feed silane toward the wafer 55, so that the GaN crystal is grown with silane added as the n-type impurity. In order to control the conductivity type of the GaN crystal to a p-type, on the other hand, the silicon material valve 76 is closed, and the magnesium material valve 75 is opened. Thus, ethylcyclopentadienyl magnesium is fed toward the wafer 55, so that the GaN crystal is grown with magnesium added as the p-type impurity.

In order to grow an AlGaN crystal on the wafer 55, the nitrogen material valve 71, the gallium material valve 72 and the aluminum material valve 73 are opened. Thus, ammonia, trimethyl gallium and trimethyl aluminum are fed onto the wafer 55, whereby the AlGaN crystal is grown on the wafer 55. In order to control the conductivity type of this AlGaN crystal to an n-type, the silicon material valve 76 is further opened to feed silane toward the wafer 55, so that the AlGaN crystal is grown with silicon added as the n-type impurity. In order to control the conductivity type of the AlGaN crystal to a p-type, on the other hand, the silicon material valve 76 is closed, and the magnesium material valve 75 is opened. Thus, ethylcyclopentadienyl magnesium is fed toward the wafer 55, so that the AlGaN crystal is grown with magnesium added as the p-type impurity.

In order to grow an AlN crystal on the wafer 55, the nitrogen material valve 71 and the aluminum material valve 73 are opened. Thus, ammonia and trimethyl aluminum are fed onto the wafer 55, whereby the AlN crystal is grown on the wafer 55. In order to control the conductivity type of this AlN crystal to an n-type, the silicon material valve 76 is further opened to feed silane toward the wafer 55, so that the AlN crystal is grown with silicon added as the n-type impurity. In order to control the conductivity type of the AlN crystal to a p-type, on the other hand, the silicon material valve 76 is closed, and the magnesium material valve 75 is opened. Thus, ethylcyclopentadienyl magnesium is fed toward the wafer 55, so that the AlN crystal is grown with magnesium added as the p-type impurity.

Growth of a group III nitride semiconductor crystal containing In and control of the conductivity type thereof can be performed similarly to the above.

Only the carrier gas valve 77 can be opened while closing the material valves 71 to 76. Thus, only the carrier gas can be fed into the treating chamber 50, for eliminating the gas remaining in the treating chamber 50 through the exhaust pipe 56 along with the carrier gas.

FIGS. 3A to 3H are schematic sectional views for illustrating a method for producing the nitride semiconductor device shown in FIG. 1.

In order to produce the nitride semiconductor device, the substrate 1 is prepared, and the layers constituting the nitride semiconductor multilayer structure portion 2 are crystal-grown on the substrate 1 by MOCVD (Metal Organic Chemical Vapor Deposition) with the apparatus having the structure shown in FIG. 2, for example.

Figure 3A:
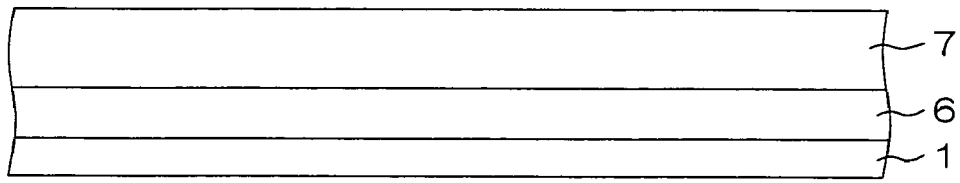
FIGS. 3A to 3H are schematic sectional views for illustrating a method for producing the nitride semiconductor device shown in FIG. 1.

More specifically, GaN is grown in the treating chamber 50 under growth conditions of a growth temperature of 1000° C. to 1100° C. and a growth time of 20 minutes to 30 minutes, to form the $n^+$-type GaN layer 6 and the $n^-$-type GaN layer 7, as shown in FIG. 3A. The growth rate is set to 1 μm/h to 1.5 μm/h, for example. Thus, the n-type layer 3 consisting of the $n^+$-type GaN layer 6 and the $n^-$-type GaN layer 7 is formed. The grown GaN can be doped with Si, for example, as the n-type impurity, as hereinabove described. The flow rate of the silicon source gas (silane) is relatively increased in order to grow the $n^+$-type GaN layer 6, while the flow rate of the silicon source gas is relatively reduced in order to grow the $n^-$-type GaN layer 7.

Figure 3B:
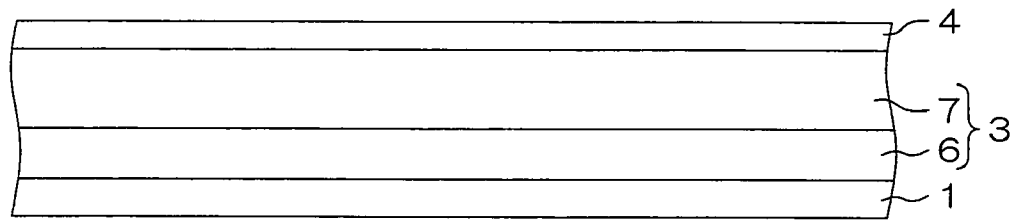

Following the formation of the $n^-$-type GaN layer 7, GaN is grown on the $n^-$-type GaN layer 7 in the treating chamber 50 under growth conditions of a growth temperature of 950° C. to 1050° C. and a growth time of 30 minutes to 50 minutes, for example, to form the p-type GaN layer 4, as shown in FIG. 3B. The growth rate is set to 0.6 μm/h to 10 μm/h, for example. The grown GaN can be doped with Mg or C, for example, as the p-type impurity, while Mg is employed in this embodiment, as hereinabove described.

Figure 3C:
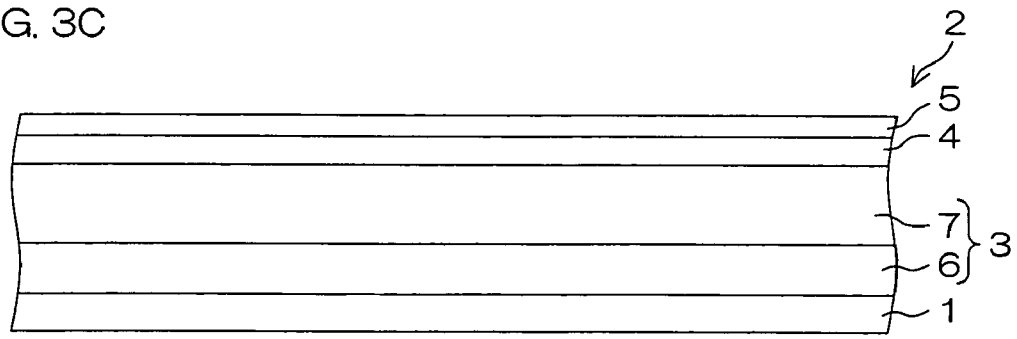
Figure 3D:
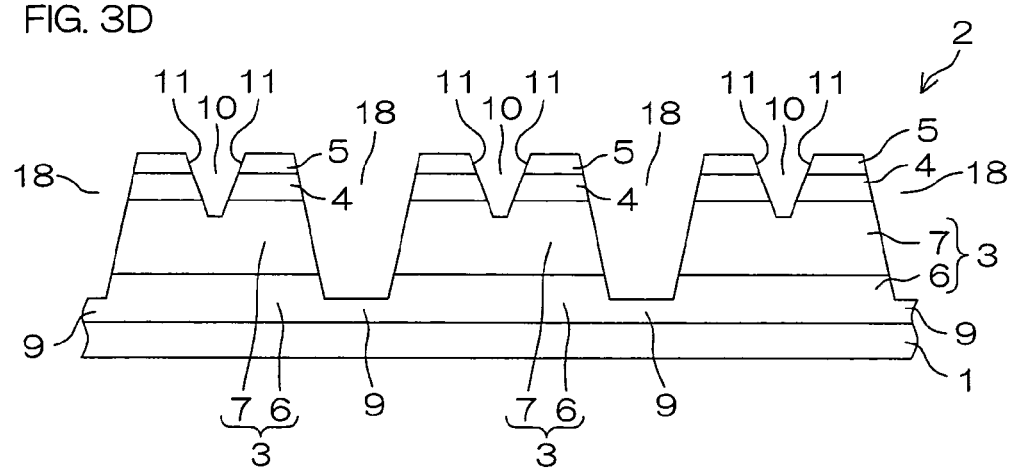

After the formation of the p-type GaN layer 4, GaN is grown in the treating chamber 50 under growth conditions of a growth temperature of 1000° C. to 1100° C. and a growth time of 5 minutes to 15 minutes, for example, to form the n$^+$-type GaN layer 5, as shown in FIG. 3C. The growth rate is set to 2 μm/h to 6 μm/h, for example. The grown GaN can be doped with Si, for example, as the n-type impurity, as hereinabove described. Thus, the nitride semiconductor multilayer structure portion 2 consisting of the n$^+$-type GaN layer 6, the n$^-$-type GaN layer 7, the p-type GaN layer 4 and the n$^+$-type GaN layer 5 is formed on the surface of the substrate 1.

In the course of the formation of the nitride semiconductor multilayer structure portion 2, the wafer 55 is never taken out from the treating chamber 50 into the air atmosphere. In other words, the layers constituting the nitride semiconductor multilayer structure portion 2 are formed by the so-called continuous growth.

On the other hand, the material valves 71 to 76 are closed and only the carrier gas valve 77 is opened after the formation of the p-type GaN layer 4 in this embodiment, so that only the carrier gas is fed into the treating chamber 50. In this state, the treating chamber 50 is put on standby for not less than one minute (for about 10 minutes, for example). Thus, the concentration of the p-type impurity (Mg) contained in the atmosphere of the treating chamber 50 is reduced due to exhaust from the exhaust pipe 56. Thereafter the n$^+$-type GaN layer 5 is crystal-grown. In other words, while the nitride semiconductor multilayer structure portion 2 is formed by continuous growth without being taken out from the treating chamber 50 into the air atmosphere at all in the course of the formation, a growth interruption step of interrupting the crystal growth for not less than one minute is carried out after the formation of the p-type GaN layer 4 in the state holding the wafer 55 in the treating chamber 50. Thereafter the crystal growth is restarted, to form the n$^+$-type GaN layer 5.

Thus, the crystal growth of the n$^+$-type GaN layer 5 is started after the p-type impurity concentration in the internal atmosphere of the treating chamber 50 is sufficiently reduced upon the formation of the p-type GaN layer 4. Therefore, the quantity of the p-type impurity incorporated into the n$^+$-type GaN layer 5 from the atmosphere can be suppressed, thereby reducing the p-type impurity concentration in the n$^+$-type GaN layer 5 to not more than $1 \times 10^{18}$ cm$^{-3}$. According to this embodiment, the crystal growth rate for the n$^+$-type GaN layer 5 is set to 2 μm/h to 6 ml/h, as hereinabove described. This growth rate for the n$^+$-type GaN layer 5 is twice to four times a general GaN crystal growth rate of about 1 μm/h to 1.5 μm/h. For example, the n-type layer 3 and the p-type GaN layer 4 may be crystal-grown at the general growth rate, and the n$^+$-type GaN layer 5 may be crystal-grown at the growth rate of twice to four times the general growth rate after a lapse of a prescribed time (about 10 minutes, for example). Thus, the concentration of the p-type impurity (per unit volume) incorporated from the atmosphere of the treating chamber 50 can be suppressed in the course of the crystal growth of the n$^+$-type GaN layer 5. Consequently, the p-type impurity concentration in the n$^+$-type GaN layer 5 can be more effectively reduced to not more than $1 \times 10^{18}$ cm$^{-3}$.

The nitride semiconductor multilayer structure portion 2 formed in this manner is thereafter etched in a striped manner. In other words, striped trenches 18 generally in the form of inverted trapezoids in section are formed by etching, to reach a layer-thickness intermediate portion of the n$^+$-type GaN layer 6 from the n$^+$-type GaN layer 5. Thus, a plurality of (three in FIG. 3D etc.) nitride semiconductor multilayer structure portions 2 are shaped in a striped manner (in the form of stripes extending in the direction perpendicular to the plane of FIG. 3D etc.), while the drawn portions 9 consisting of the extensions of the n$^+$-type GaN layer 6 are formed at the same time. The trenches 18 can be formed by dry etching (anisotropic etching) with chlorine-based gas, for example.

Then, the trench 10 having the generally V-shaped section is formed in the vicinity of the width-directional intermediate portion of each nitride semiconductor multilayer structure portion 2 along the longitudinal direction of the nitride semiconductor multilayer structure portion 2. The trench 10 can be formed by dry etching (anisotropic etching) with chlorine-based gas, similarly to the trenches 18. After the dry etching, a wet etching treatment for improving the wall surfaces 11 of the trench 10 damaged by the dry etching may be thereafter performed, if necessary. An alkaline etching solution such as KOH (potassium hydroxide) or NaOH (sodium hydroxide) is preferably employed for the wet etching. The damaged wall surfaces 11 can also be improved by wet etching with an acidic etching solution such as HF (hydrofluoric acid) or HCl (hydrochloric acid). Thus, an Si-based oxide or an oxide of Ga is removed, and the wall surfaces 11 can be leveled off. The damages of the wall surfaces 11 are so reduced that the crystal states of the subsequently formed channel layers 14 (see FIG. 1) can be excellently kept and the interfaces between the wall surfaces 11 (channel layers 14) and the gate insulating film 12 can be rendered excellent, whereby the interfacial levels can be reduced. Thus, channel resistance can be reduced, and a leakage current can be suppressed. The wet etching treatment can be replaced with a low-damage dry etching treatment.

Figure 3E:
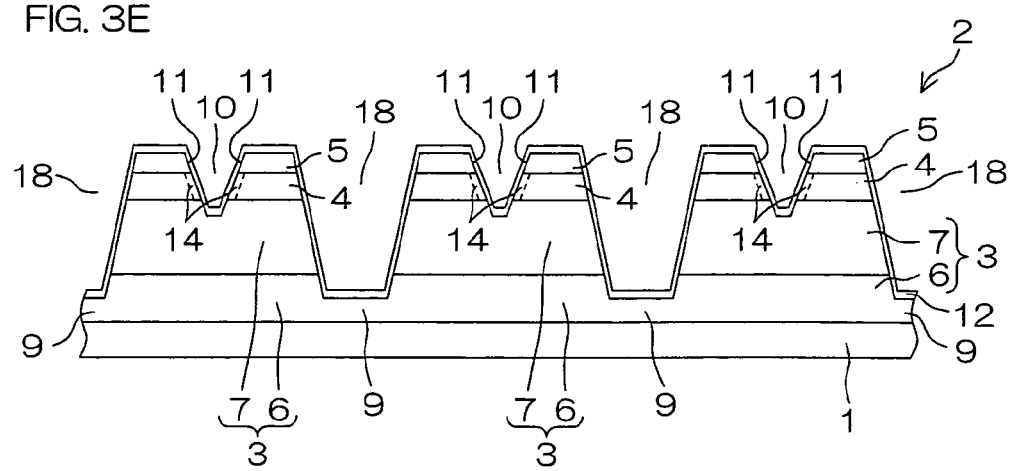

Then, the substrate 1 provided with the nitride semiconductor multilayer structure portion 2 is introduced into an ECR (Electron Cyclotron Resonance) sputtering apparatus. Ar$^+$ plasma having energy of about 30 eV, for example, is generated in the ECR sputtering apparatus and nitrogen gas is introduced thereinto, to form a nitrogen atmosphere in the apparatus. In this case, the nitrogen atmosphere denotes an environment such as a high-temperature nitrogen gas environment or a nitrogen plasma environment, or the like, irradiated with nitrogen molecules, nitrogen atoms, nitrogen radicals and a compound of nitrogen. A portion around the surface of the nitride semiconductor multilayer structure portion 2 is nitrided due to the nitrogen atmosphere in the apparatus. Then, the Ar$^+$ plasma is applied to the surface of the nitride semiconductor multilayer structure portion 2 for several seconds. Thus, the semiconductor surface portions of the p-type GaN layer 4 exposed due to the formation of the wall surfaces 11 are converted to form the channel layers 14 different in conductivity from the p-type GaN layer 4, as shown in FIG. 3E. The channel layers 14 may not necessarily be formed with the Ar$^+$ plasma, but can alternatively be formed by introduction of Si or O (oxygen).

The channel layers 14 can also be formed by regrowing a group III nitride semiconductor from the exposed wall surfaces 11, in place of the method of converting the semiconductor surface portions of the p-type GaN layer 4. In this case, the channel layers 14 can also be formed by MOCVD with the apparatus shown in FIG. 2. The conductivity can be controlled by controlling addition of an impurity.

Then, the gate insulating film 12 is formed to cover the wall surfaces 11 of the generally V-shaped trench 10 as well as the surfaces of the n$^+$-type GaN layer 6, the n$^-$-type GaN layer 7, the p-type GaN layer 4 and the n$^+$-type GaN layer 5, as shown in FIG. 3E. In order to form the gate insulating film 12, ECR sputtering is preferably applied.

Figure 3F:
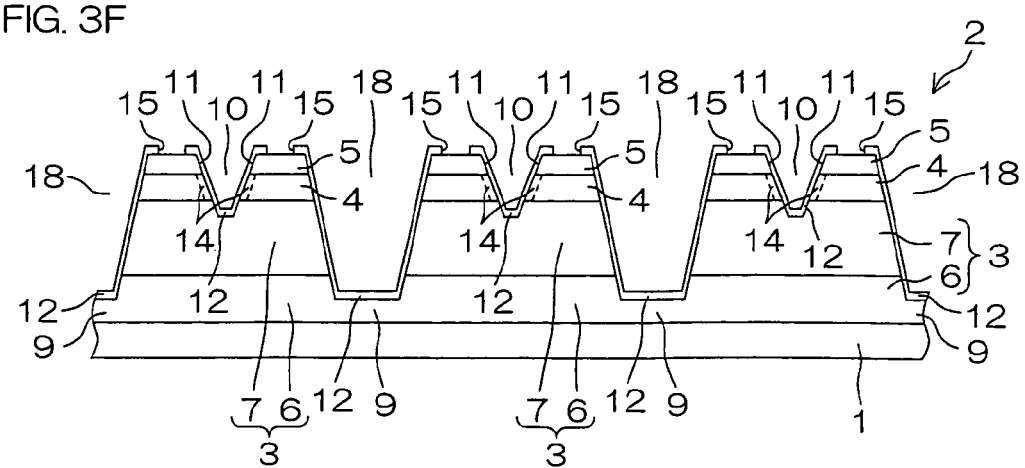

Thereafter the gate insulating film 12 is dry-etched in a striped manner through a photoresist film (not shown) having openings in regions for forming the openings 15 by well-known photolithography. Thus, the openings 15 are formed to partially expose the n⁺-type GaN layer 5, as shown in FIG. 3F.

Figure 3G:
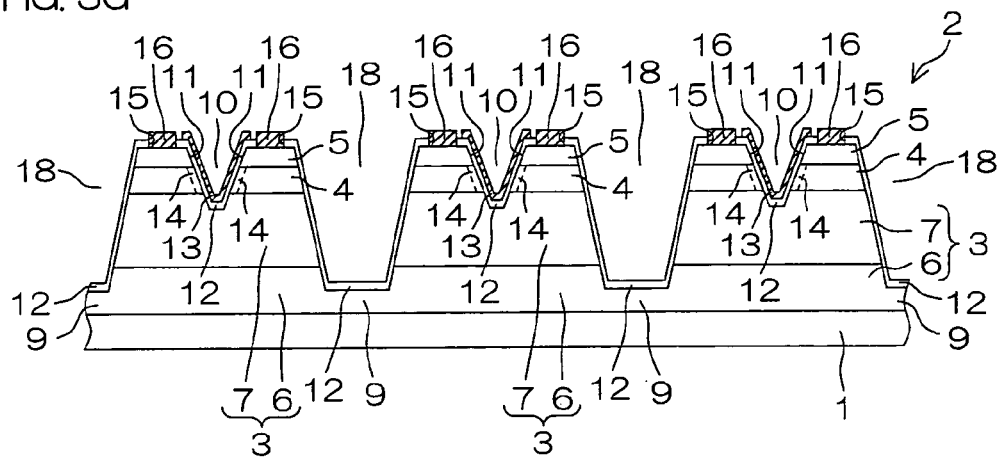

Then, metals (Ti and Al, for example) employed as the materials for the source electrodes 16 are sputtered in order of Ti and Al through another photoresist film (not shown) having openings in regions for forming the source electrodes 16 by well-known photolithography. Thereafter the photoresist film is so removed as to lift off unnecessary portions (other than the source electrodes 16) of the metals along with the photoresist film. Thus, the source electrodes 16 are formed as shown in FIG. 3G. After the formation of the source electrodes 16, thermal alloying (annealing) is so performed that the source electrodes 16 are in ohmic contact with the n⁺-type GaN layer 5.

Thereafter the gate electrode 13 is formed to be opposed to the wall surfaces 11 and the edge portions of the trench 10 on the upper surface of the n⁺-type GaN layer 5 through the gate insulating film 12 by a method similar to that for forming the source electrodes 16, as shown in FIG. 3G.

Figure 3H:
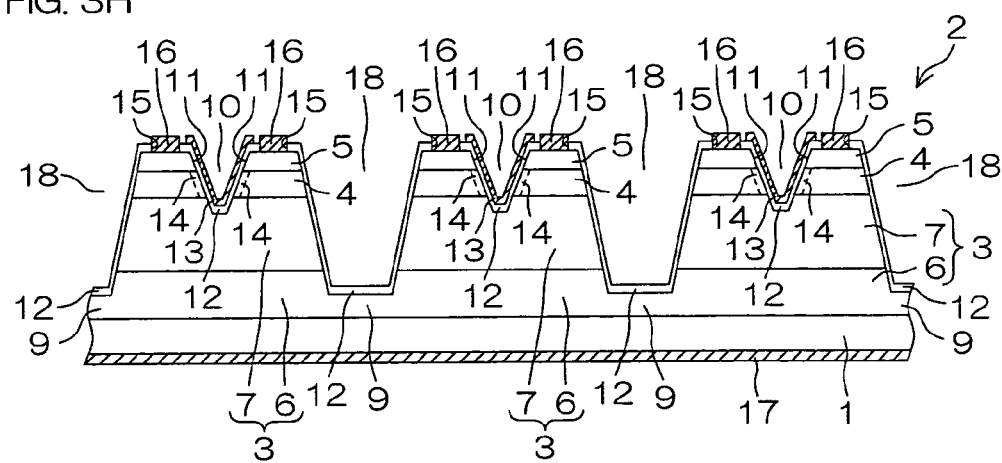

Then, the drain electrode 17 is formed on the other surface (lower surface) of the substrate 1 by a method similar to that for forming the source electrodes 16, as shown in FIG. 3H. Thus, the nitride semiconductor device shown in FIG. 1 can be obtained.

The plurality of semiconductor multilayer structure portions 2 formed in the striped manner constitute unit cells respectively. The gate electrodes 13 and the source electrodes 16 of these nitride semiconductor multilayer structure portions 2 are connected in common on unshown positions respectively. The drain electrode 17, formed in contact with the substrate 1, is common to all cells.

Figure 4A:
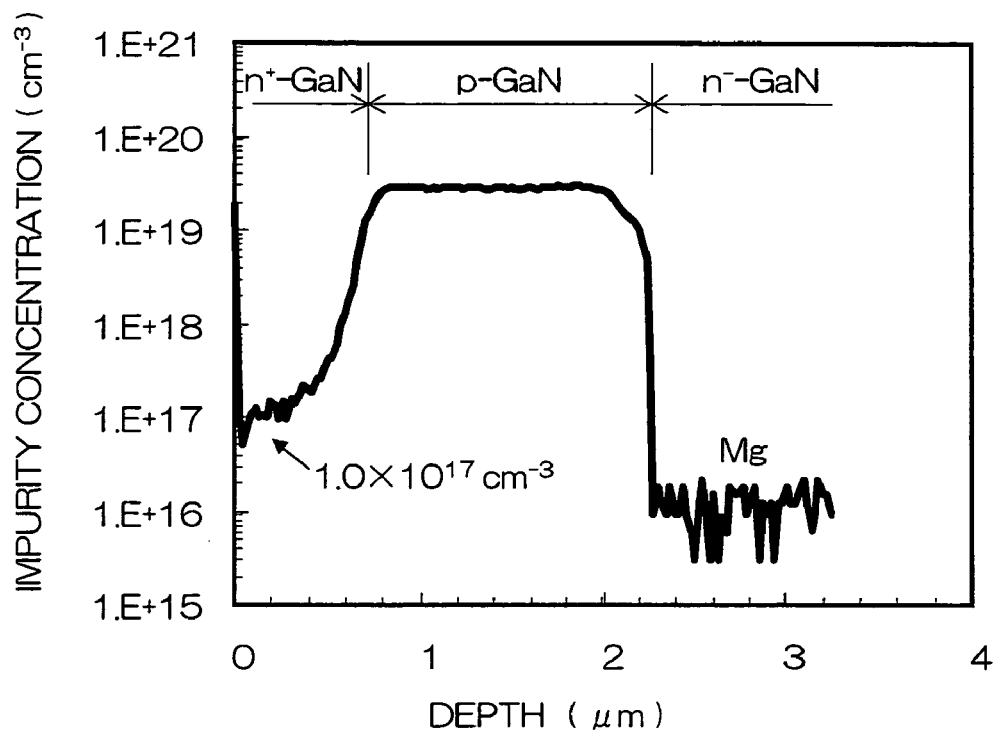
FIG. 4A illustrates the concentration profile of Mg contained in an $n^-$-type GaN layer, an n-type AlGaN layer and a p-type GaN layer shown in FIG. 1.
Figure 4B:
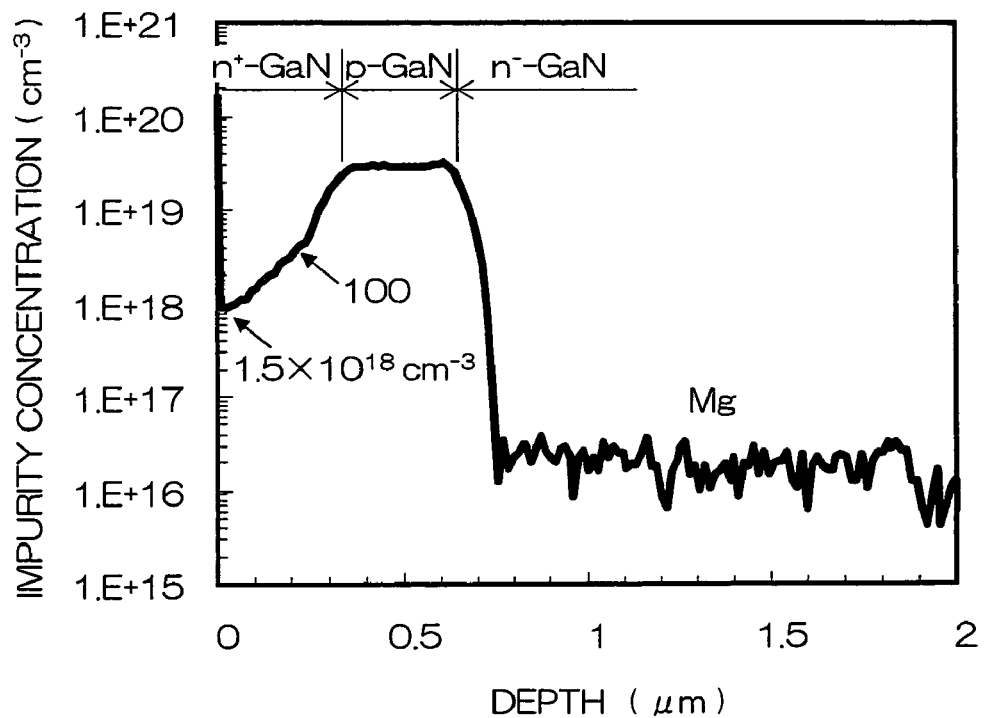
FIG. 4B illustrates an Mg concentration profile in comparative example.

FIG. 4A illustrates an example (Inventive Example) of the concentration profile of Mg contained in the n⁻-type GaN layer 7, the p-type GaN layer 4 and the n⁺-type GaN layer 5 shown in FIG. 1. FIG. 4B illustrates an example of a similar concentration profile in a case (comparative example) of forming the n⁺-type GaN layer 5 without waiting for reduction of the p-type impurity concentration in the treating chamber 50 after forming the p-type GaN layer 4. Referring to FIGS. 4A and 4B, the abscissas show depth-directional positions from the surfaces of the devices.

As obvious from FIG. 4A, the Mg concentration profile in the vicinity of the interface between the p-type GaN layer 4 and the n⁺-type GaN layer 5 can be steepened by growing the n⁺-type GaN layer 5 after sufficiently eliminating the p-type impurity (magnesium source gas) from the treating chamber 50 upon the growth of the p-type GaN layer 4 and setting the growth rate for the n⁺-type GaN layer 5 to twice to four times the general growth rate. Thus, the Mg concentration in the n⁺-type GaN layer 5 can be reduced to not more than $1 \times 10^{18}$ cm⁻³. In a prototype prepared by the inventor, the electron mobility in the n⁺-type GaN layer 5 (source layer) was 123 μcm²/V·sec.

On the other hand, an Mg memory effect denoted by reference numeral 100 remarkably appears when the magnesium source gas is not sufficiently eliminated after the growth of the p-type GaN layer 4 and the n⁺-type GaN layer 5 is grown at the general growth rate, as obvious from FIG. 4B. Consequently, the Mg concentration profile in the vicinity of the interface between the p-type GaN layer 4 and the n⁺-type GaN layer 5 is blunted, and the Mg concentration in the n⁺-type GaN layer 5 is $1.5 \times 10^{18}$ cm⁻³ at the minimum. In this case, the electron mobility in the n⁺-type GaN layer 5 (source layer) is less than 0.1 cm²/V·sec, for example, to allow no transistor operation.

In the nitride semiconductor device according to this embodiment, the p-type impurity concentration in the n⁺-type GaN layer 5 is not more than $1 \times 10$ cm⁻³ in all portions. Therefore, the n⁺-type GaN layer 5 exhibits excellent n-type properties, and can be inhibited from getting highly resistant as a whole. Thus, excellent transistor characteristics can be implemented, and a low-resistance transistor can be implemented.

A drain current $I_{ds}$ can be expressed as follows:

$$I_{ds} = \frac{V_{ds}}{\frac{V_{ds}}{g_m(V_{gs} - R_{source}I_{ds} - V_{th})} + R_{other}}$$

where $R_{source}$ represents the sum of contact resistance of the source electrode and the resistance of the source layer, $R_{other}$ represents the sum of resistance other than the channel resistance, $V_{ds}$ represents a drain voltage, $V_{gs}$ represents the gate voltage, $g_m$ represents mutual conductance, and $V_{th}$ represents the threshold voltage.

It is understood from the above expression that the drain current is remarkably reduced when the source layer has high resistance, i.e., low electron mobility. Therefore, the drain current can be increased due to the structure of this embodiment capable of reducing the resistance of the source layer, thereby enabling an excellent transistor operation.

Figure 5:
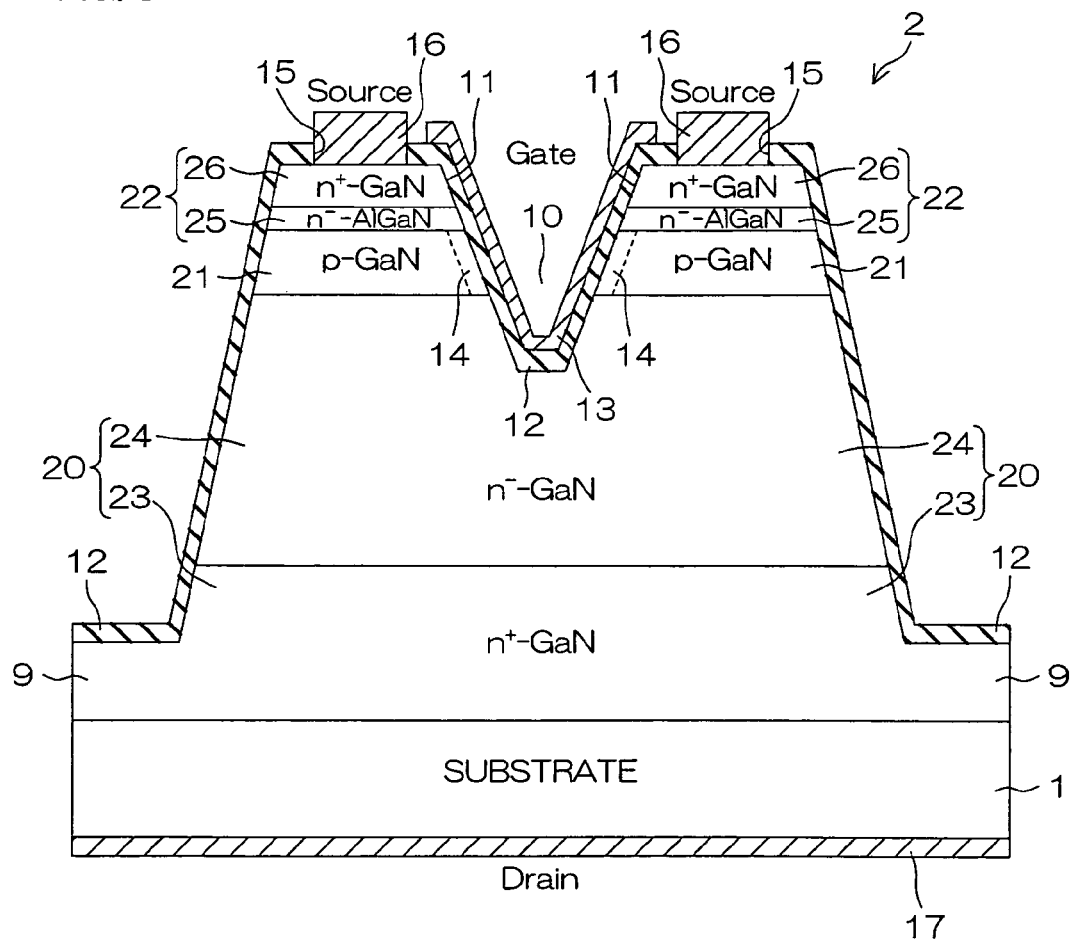
FIG. 5 is a schematic sectional view for illustrating the structure of a nitride semiconductor device according to a second embodiment of the present invention.

FIG. 5 is a schematic sectional view for illustrating the structure of a nitride semiconductor device according to a second embodiment of the present invention. Referring to FIG. 5, portions corresponding to those shown in FIG. 1 are denoted by the same reference numerals. In the following, redundant description is omitted as to the portions denoted by the same reference numerals.

According to this embodiment, a nitride semiconductor multilayer structure portion 2 includes an n-type layer 20 (first layer), a p-type GaN layer 21 (second layer) laminated on the n-type layer 20 and another n-type layer 22 laminated on the p-type GaN layer 21.

The n-type layer 20 includes an n⁺-type GaN layer 23 formed on one surface (upper surface) of a substrate 1 and an n⁻-type GaN layer 24 laminated on the n⁺-type GaN layer 23.

The n⁺-type GaN layer 23 has an n-type impurity concentration of $1 \times 10^{18}$ cm⁻³ to $1 \times 10^{20}$ cm⁻³, for example, higher than that of the n⁻-type GaN layer 24. On the other hand, the n-type impurity concentration in the n⁻-type GaN layer 24 is $1 \times 10^{16}$ cm⁻³ to $1 \times 10^{18}$ cm⁻³, for example (more specifically, $1 \times 10^{17}$ cm⁻³, for example).

The p-type impurity concentration in the p-type GaN layer 21 is $1 \times 10^{18}$ cm⁻³ to $5 \times 10^{19}$ cm⁻³, for example (more specifically, $4 \times 10^{19}$ cm⁻³, for example).

The n-type layer 22 includes an n-type AlGaN layer 25 (fourth layer) formed in contact with the upper surface of the p-type GaN layer 21 and an n⁺-type GaN layer 26 (third layer) laminated on the n-type AlGaN layer 25.

The n-type impurity concentration in the n⁺-type GaN layer 26 is $1 \times 10^{18}$ cm⁻³ to $1 \times 10^{20}$ cm⁻³, for example (more specifically, $3 \times 10^{18}$ cm⁻³, for example). On the other hand, the n-type impurity concentration in the n-type AlGaN layer 25 is $1 \times 10^{17}$ cm⁻³ to $4 \times 10^{18}$ cm³, for example (more specifically, $3 \times 10^{18}$ cm⁻³, for example). The n⁺-type GaN layer 26 is grown in the same treating chamber after the growth of the p-type GaN layer 21 and the n-type AlGaN layer 25. While the growth temperature for the n⁺-type GaN layer 26 is higher than that for the p-type GaN layer 21, the p-type impurity contained in the p-type GaN layer 21 is inhibited from diffusing into the n⁺-type GaN layer 26 in the course of the formation of the n⁺-type GaN layer 26, due to the function of the n-type AlGaN layer 25. Thus, the p-type impurity concentration in the n⁺-type GaN layer 26 resulting from a p-type impurity contained in the atmosphere of the treating chamber is suppressed to not more than $1 \times 10^{18}$ cm⁻³ (not more than $1 \times 10^{16}$ cm⁻³ in this embodiment).

The thickness of the n-type AlGaN layer 25 is preferably 10 nm to 50 nm. The n-type AlGaN layer 25 is expressed in a composition formula $Al_zGa_{1-z}N$ ($0 \leqq z \leqq 1$), where z representing the quantity of Al contained in the n-type AlGaN layer 25 is preferably 0.1 to 0.3.

The nitride semiconductor multilayer structure portion 2 is etched from the n⁺-type GaN layer 26 up to a depth exposing the n⁺-type GaN layer 23 in a direction across the laminating interfaces thereof, to have a generally trapezoidal section. The n⁺-type GaN layer 23 has drawn portions 9 drawn from both sides of the nitride semiconductor multilayer structure portion 2 in the width direction. In other words, the drawn portions 9 are constituted of extensions of the n⁺-type GaN layer 23 in this embodiment.

A trench 10 is formed along the longitudinal direction of the nitride semiconductor multilayer structure portion 2 with a depth reaching an intermediate portion of the n⁻-type GaN layer 24 from the n⁺-type GaN layer 26 through the n-type AlGaN layer 25 and the p-type GaN layer 21.

Wall surfaces 11 are formed to extend over the n⁻-type GaN layer 24, the p-type GaN layer 21, the n-type AlGaN layer 25 and the n⁺-type GaN layer 26.

In the p-type GaN layer 21, channel layers 14 are formed on semiconductor surface portions of regions around the wall surfaces 11, similarly to the case of the aforementioned first embodiment. The channel layers 14 are made of a semiconductor different in conductivity from the p-type GaN layer 21, such as a p⁻-type semiconductor having a lower acceptor concentration than the p-type GaN layer 21, for example. The thickness of the channel layers 14 (thickness in the directions orthogonal to the wall surfaces 11) is several nm to 100 nm, for example. The channel layers 14 may be made of the semiconductor different in conductivity from the p-type GaN layer 21, and the material therefor is not restricted to the p⁻-type semiconductor, but may be any of an n-type semiconductor containing an n-type impurity, an i-type semiconductor hardly containing impurities and a semiconductor containing n-type and p-type impurities.

A gate electrode 13 is opposed to the wall surfaces 11, i.e., the n-type GaN layer 24, the channel layers 14, the p-type GaN layer 21, the n-type AlGaN layer 25 and the n⁺-type GaN layer 26 through a gate insulating film 12, and formed to extend up to portions close to edge portions of the trench 10 on the upper surface of the n⁺-type GaN layer 26.

Source electrodes 16 are in ohmic contact with the n⁺-type GaN layer 26. The remaining structure as well as the operation of this embodiment are similar to those of the aforementioned first embodiment.

FIGS. 6A to 6H are schematic sectional views for illustrating a method for producing the nitride semiconductor device shown in FIG. 5.

In order to produce this nitride semiconductor device, the substrate 1 is prepared, and the layers constituting the nitride semiconductor multilayer structure portion 2 are epitaxially grown on this substrate 1 with the aforementioned treating apparatus shown in FIG. 2 by MOCVD, for example.

Figure 6A:
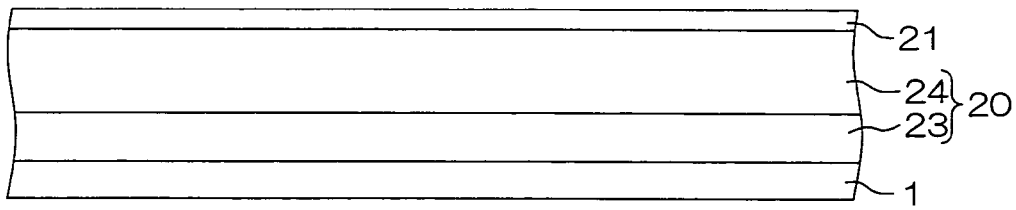
FIGS. 6A to 6H are schematic sectional views for illustrating a method for producing the nitride semiconductor device shown in FIG. 5.

First, GaN is grown under growth conditions of a growth temperature of 1000° C. to 1100° C. and a growth time of 20 minutes to 30 minutes, to form the n⁺-type GaN layer 23 and the n⁻-type GaN layer 24, as shown in FIG. 6A. The growth rate is set to 1 μm/h to 1.5 μm/h, for example. The grown GaN can be doped with Si, for example, as the n-type impurity. Thus, the n-type layer 20 is formed on one surface (upper surface) of the substrate 1. The flow rate of silicon source gas (silane) is relatively increased in order to grow the n⁺-type GaN layer 23, while the flow rate of the silicon source gas is relatively reduced in order to grow the n⁻-type GaN layer 24.

Then, GaN is grown on the n⁻-type GaN layer 24 under growth conditions of a growth temperature of 950° C. to 1050° C. and a growth time of 30 minutes to 50 minutes, to form the p-type GaN layer 21, as shown in FIG. 6A. The growth rate is set to 0.6 μm/h to 10 μm/h, for example. The grown GaN can be doped with Mg or C, for example, as the p-type impurity, while Mg is employed in this embodiment.

Figure 6B:
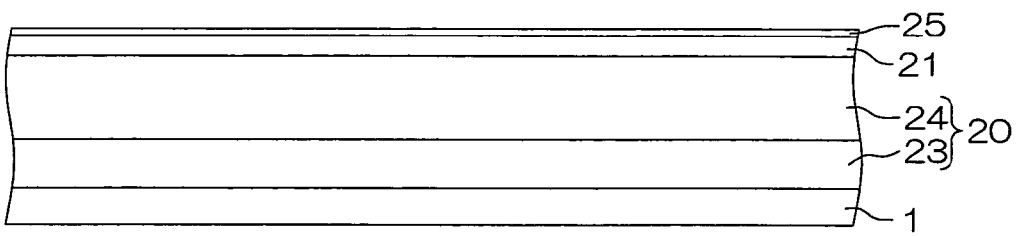

Then, AlGaN is grown on the p-type GaN layer 21 under growth conditions of a growth temperature of 1000° C. to 1100° C. and a growth time of 2 minutes to 20 minutes, for example, to form the n-type AlGaN layer 25, as shown in FIG. 6B. The growth rate is set to 1 nm/min. to 10 nm/min., for example. The grown AlGaN can be doped with Si, for example, as the n-type impurity.

Figure 6C:
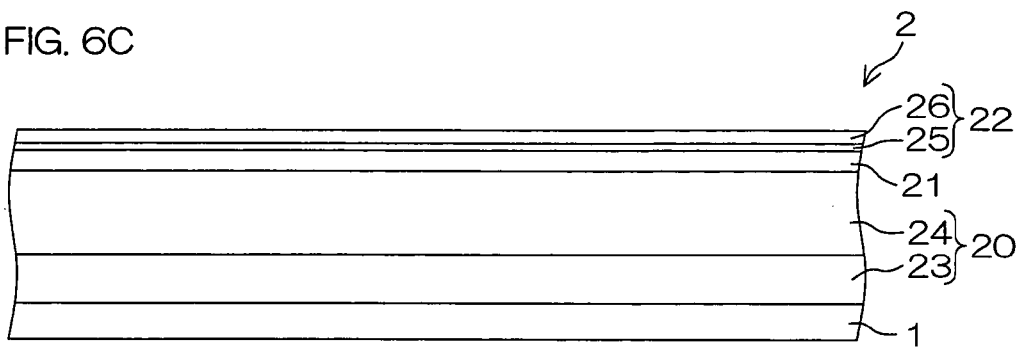

After the formation of the n-type AlGaN layer 25, GaN is grown on the n-type AlGaN layer 25 under growth conditions of a growth temperature of 1000° C. to 1100° C. and a growth time of 5 minutes to 15 minutes, for example, to form the n⁺-type GaN layer 26, as shown in FIG. 6C. The growth rate is set to 2 μm/h to 6 ml/h, for example. The grown GaN can be doped with Si, for example, as the n-type impurity. Thus, the n-type layer 22 consisting of the n-type AlGaN layer 25 and the n⁺-type GaN layer 26 is formed, and the nitride semiconductor multilayer structure portion 2 consisting of the n-type layer 20, the p-type GaN layer 21 and the n-type layer 22 is formed on the surface of the substrate 1.

In the course of the formation of the nitride semiconductor multilayer structure portion 2 with the apparatus shown in FIG. 2, the wafer 55 is never taken out from the treating chamber 50 into the air atmosphere. In other words, the layers constituting the nitride semiconductor multilayer structure portion 2 are formed by the so-called continuous growth.

On the other hand, the source gas valves 71 to 76 are closed and only the carrier gas valve 77 is opened after the formation of the p-type GaN layer 21 in this embodiment, so that only the carrier gas is fed into the treating chamber 50. In this state, the treating chamber 50 is put on standby for not less than one minute (for about 10 minutes, for example). Thus, the concentration of the p-type impurity (Mg) contained in the atmosphere of the treating chamber 50 is reduced due to exhaust from the exhaust pipe 56. Thereafter the n-type AlGaN layer 25 and the n⁺-type GaN layer 26 are crystal-grown. In other words, while the nitride semiconductor multilayer structure portion 2 is formed by continuous growth without being taken out from the treating chamber 50 into the air atmosphere at all in the course of the formation, a growth interruption step of interrupting the crystal growth is carried out after the formation of the p-type GaN layer 21 in the state holding the wafer 55 in the treating chamber 50. Thereafter the crystal growth is restarted, to form the n-type AlGaN layer 25 and the n⁺-type GaN layer 26.

Thus, the crystal growth of the n-type AlGaN layer 25 and the n⁺-type GaN layer 26 is started after the p-type impurity concentration in the internal atmosphere of the treating chamber 50 is sufficiently reduced upon the formation of the p-type GaN layer 21. Therefore, the quantity of the p-type impurity incorporated into the n-type AlGaN layer 25 and the n$^+$-type GaN layer 26 from the atmosphere can be suppressed, thereby reducing the p-type impurity concentration in the n$^+$-type GaN layer 26 to not more than $1\times10^{18}$ cm$^{-3}$.

According to this embodiment, the crystal growth rate for the n$^+$-type GaN layer 26 is set to 2 μm/h to 6 μm/h, as hereinabove described. This growth rate for the n$^+$-type GaN layer 26 is twice to four times the general GaN crystal growth rate of about 1 μm/h to 1.5 μm/h. For example, the n-type layer 20 and the p-type GaN layer 21 may be crystal-grown at the general growth rate, and the n-type AlGaN layer 25 and the n$^+$-type GaN layer 26 may be crystal-grown at the growth rate of twice to four times the general growth rate after a lapse of a prescribed time (about 10 minutes, for example). Thus, the concentration of the p-type impurity (per unit volume) incorporated from the atmosphere of the treating chamber 50 can be suppressed in the course of the crystal growth of the n$^+$-type GaN layer 26. Consequently, the p-type impurity concentration in the n$^+$-type GaN layer 26 can be more effectively reduced to not more than $1\times10^{18}$ cm$^{-3}$.

Figure 6D:
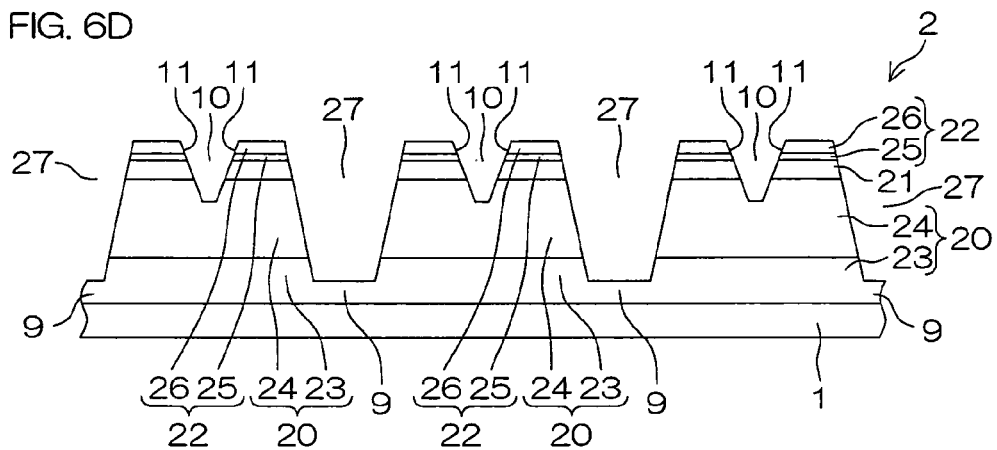

The nitride semiconductor multilayer structure portion 2 formed in this manner is thereafter etched in a striped manner. In other words, trenches 27 generally in the form of inverted trapezoids in section are formed by etching, to reach a layer-thickness intermediate portion of the n$^+$-type GaN layer 23 from the n$^+$-type GaN layer 26. Thus, a plurality of (three in this embodiment) nitride semiconductor multilayer structure portions 2 are shaped in a striped manner as shown in FIG. 6D, while the drawn portions 9 consisting of the extensions of the n$^+$-type GaN layer 23 are formed at the same time. The trenches 27 can be formed by dry etching (anisotropic etching) with chlorine-based gas, for example.

Then, the trench 10 having the generally V-shaped section is formed in the vicinity of the width-directional intermediate portion of each nitride semiconductor multilayer structure portion 2 along the longitudinal direction of the nitride semiconductor multilayer structure portion 2. The trench 10 can be formed by dry etching (anisotropic etching) with chlorine-based gas, similarly to the trenches 27. After the dry etching, a wet etching treatment for improving the wall surfaces 11 of the trench 10 damaged by the dry etching may be thereafter performed, if necessary. An alkaline etching solution such as KOH (potassium hydroxide) or NaOH (sodium hydroxide) is preferably employed for the wet etching. The damaged wall surfaces 11 can also be improved by wet etching with an acidic etching solution such as HF (hydrofluoric acid) or HCl (hydrochloric acid). Thus, an Si-based oxide or an oxide of Ga is removed, and the wall surfaces 11 can be leveled off. The damages of the wall surfaces 11 are so reduced that the crystal states of the subsequently formed channel layers 14 (see FIG. 5) can be excellently kept and the interfaces between the wall surfaces 11 (channel layers 14) and the gate insulating film 12 can be rendered excellent, whereby the interfacial levels can be reduced. Thus, channel resistance can be reduced, and a leakage current can be suppressed. The wet etching treatment can be replaced with a low-damage dry etching treatment.

Then, the channel layers 14 are formed on semiconductor surface portions of the p-type GaN layer 21 exposed due to the formation of the wall surfaces 11, similarly to the case of the first embodiment. The channel layers 14 can alternatively be formed by converting the semiconductor surface portions of the p-type GaN layer 21 or by regrowing a group III nitride semiconductor from the semiconductor surface portions of the p-type GaN layer 21, as hereinabove described.

Figure 6E:
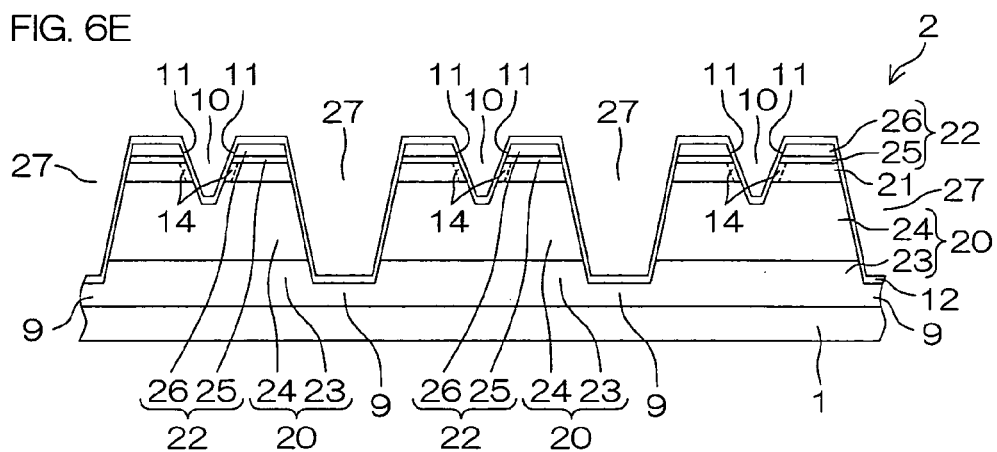

Then, the gate insulating film 12 is formed to cover the wall surfaces 11 of the generally V-shaped trench 10 as well as the surfaces of the n$^+$-type GaN layer 23, the n$^-$-type GaN layer 24, the p-type GaN layer 21, the n-type AlGaN layer 25 and the n$^+$-type GaN layer 26, as shown in FIG. 6E. In order to form the gate insulating film 12, ECR sputtering is preferably applied.

Figure 6F:
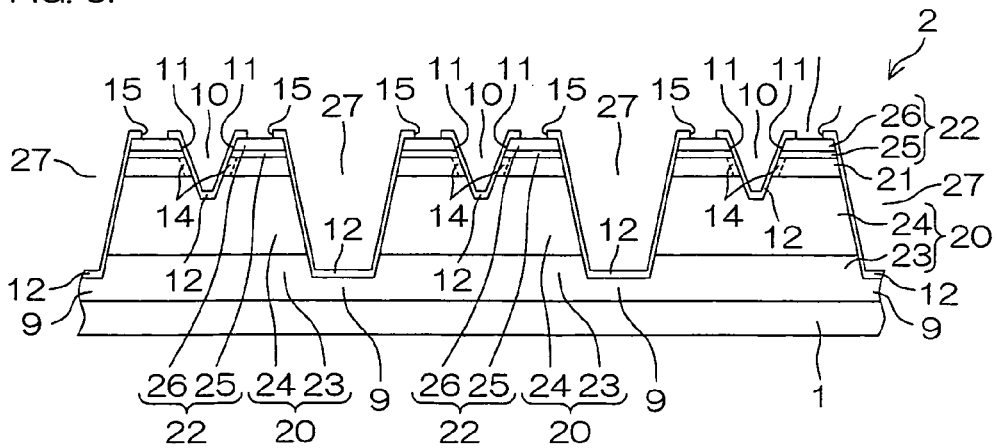

Thereafter the gate insulating film 12 is dry-etched in a striped manner through a photoresist film (not shown) having openings in regions for forming openings 15 by well-known photolithography. Thus, the openings 15 are formed to partially expose the n$^+$-type GaN layer 26, as shown in FIG. 6F.

Figure 6G:
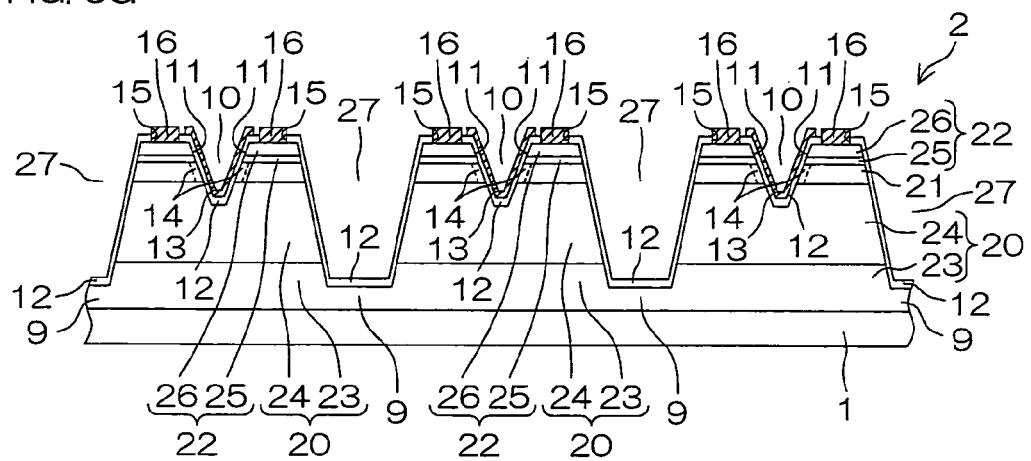

Then, metals (Ti and Al, for example) employed as the materials for the source electrodes 16 are sputtered in order of Ti and Al through another photoresist film (not shown) having openings in regions for forming the source electrodes 16 by well-known photolithography. Thereafter the photoresist film is so removed as to lift off unnecessary portions (other than the source electrodes 16) of the metals along with the photoresist film. Thus, the source electrodes 16 are formed as shown in FIG. 6G. After the formation of the source electrodes 16, thermal alloying (annealing) is so performed that the source electrodes 16 are in ohmic contact with the n$^+$-type GaN layer 26.

Thereafter the gate electrode 13 is formed to be opposed to the edge portions of the trench 10 on the wall surfaces 11 and the upper surface of the n$^+$-type GaN layer 26 through the gate insulating film 12 by a method similar to that for forming the source electrodes 16, as shown in FIG. 6G.

Figure 6H:
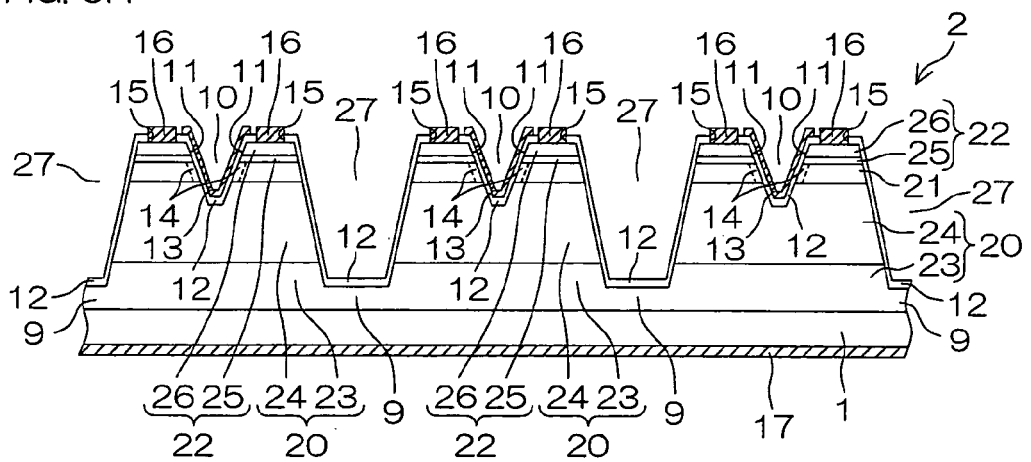
Figure 8:
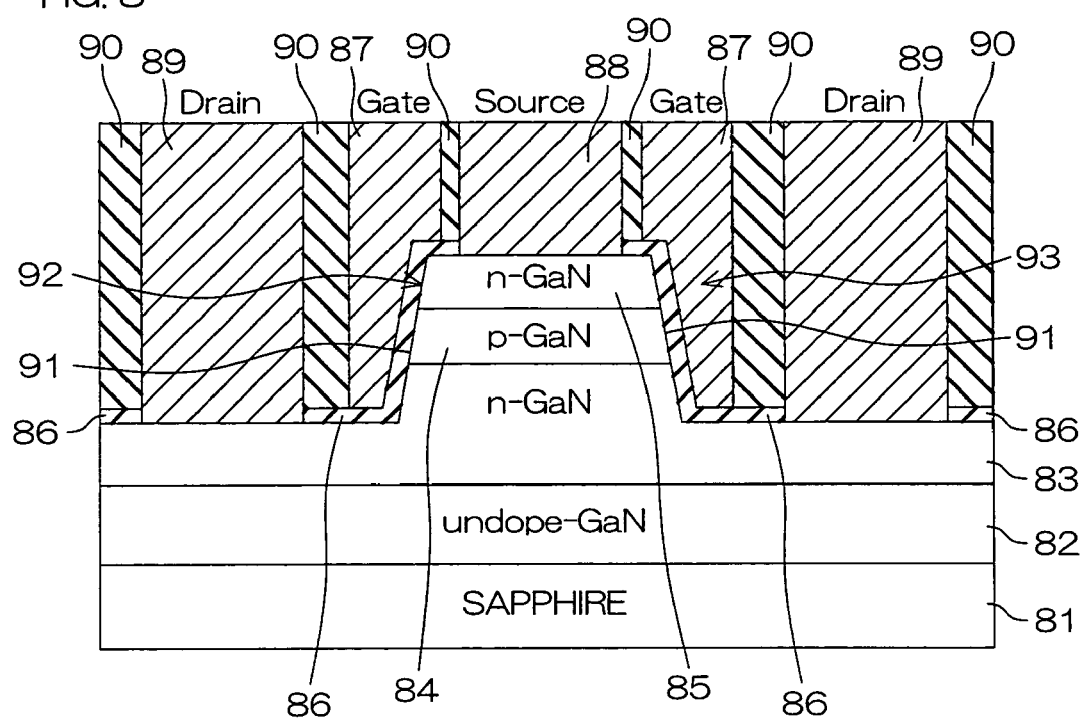
FIG. 8 is a schematic sectional view for illustrating the structure of a conventional nitride semiconductor device.

Then, a drain electrode 17 is formed on the other surface (lower surface) of the substrate 1 by a method similar to that for forming the source electrodes 16, as shown in FIG. 6H. Thus, the nitride semiconductor device shown in FIG. 5 can be obtained.

The plurality of semiconductor multilayer structure portions 2 constitute unit cells respectively. The gate electrodes 13 and the source electrodes 16 of these nitride semiconductor multilayer structure portions 2 are connected in common on unshown positions respectively. The drain electrode 17, formed in contact with the substrate 1, is common to all cells.

FIG. 7 illustrates the concentration profile of Mg contained in the p-type GaN layer 21, the n-type AlGaN layer 25 and the n$^+$-type GaN layer 26 shown in FIG. 5. Referring to FIG. 7, the abscissas show depth-directional positions from the surface of the device.

In this nitride semiconductor device, the n-type AlGaN layer 25 is formed on a portion of the n-type layer 22 in contact with the p-type GaN layer 21. The diffusion rate of Mg with respect to AlGaN is slower than that with respect to GaN, and hence Mg does not diffuse up to the n$^+$-type GaN layer 26 in the course of the growth of GaN constituting the n$^+$-type GaN layer 26, even if the p-type GaN layer 21 is doped with Mg in a high concentration ($1\times10^{18}$ cm$^{-3}$ to $5\times10^{19}$ cm$^{-3}$, for example). Therefore, the Mg concentration profile in the vicinity of the interface between the n-type layer 22 and the p-type GaN layer 21 can be steepened, as shown in FIG. 7. The Mg concentration in the n$^+$-type GaN layer 26 can be suppressed to not more than $1\times10^{18}$ cm$^{-3}$, due to the function of the n-type AlGaN layer 25. Thus, the n-type layer 22 can be inhibited from getting highly resistant as a whole, whereby the resistance of the device can be reduced.

While the two embodiments of the present invention have been described, the present invention may be embodied in other ways.

For example, while the AlGaN layer 25 is interposed between the p-type GaN layer 21 and the n$^+$-type GaN layer 26 in the aforementioned second embodiment (FIG. 5), similar effects can be attained also when an AlN layer is interposed in place of the AlGaN layer 25.

While MOCVD is applied as the method of growing GaN or AlGaN in each of the aforementioned embodiments, another method such as LPE (Liquid Phase Epitaxy), VPE (Vapor Phase Epitaxy) or MBE (Molecular Beam Epitaxy) may alternatively be applied.

While the trench 10 having the generally V-shaped section is formed on the nitride semiconductor multilayer portion 2 in each of the aforementioned embodiments, the trench 10 may have another shape such as an inverted trapezoidal shape, a U-shape, a rectangular shape or a trapezoidal shape.

While the wall surfaces 11 are planar surfaces inclined with respect to the substrate 1 in each of the aforementioned embodiments, the wall surfaces 11 may not necessarily be inclined or planar. In other words, the wall surfaces 11 may be planar surfaces perpendicular to the substrate 1, or may be curved surfaces.

While the channel layers 14 are formed on the semiconductor surface portions of the wall surfaces 11 of the p-type GaN layer 4 or 21 in each of the aforementioned embodiments, the channel layers 14 may be omitted. In this case, the source and the drain can be conducted by supplying a proper voltage to the gate electrode 13 thereby forming inversion layers (channels) in the vicinity of the wall surfaces 11 of the p-type GaN layer 4 or 21.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-340214 filed with the Japanese Patent Office on Dec. 28, 2007, the disclosure of which is incorporated herein by reference.

What is claimed is:

1. A nitride semiconductor device comprising:
an n-type first layer made of a group III nitride semiconductor;
a p-type second layer made of a group III nitride semiconductor with a p-type impurity content of not less than $1\times10^{18}$ cm$^{-3}$ provided on the first layer;
an n-type third layer made of a group III nitride semiconductor with a p-type impurity content of not more than $1\times10^{18}$ cm$^{-3}$ provided on the second layer, wherein a group III nitride semiconductor multilayer structure includes the first layer, the second layer and the third layer;
a wall surface extending over the first layer, the second layer and the third layer;
a gate insulating film formed such that the gate insulating film is opposed to the wall surface;
a gate electrode formed such that the gate electrode is opposed to the second layer through the gate insulating film;
a drain electrode formed such that the drain electrode is in ohmic contact with the first layer;
a source electrode formed such that the source electrode is in ohmic contact with the third layer; and
a channel layer, different in conductivity from the second layer, formed on a semiconductor surface portion of the second layer on the wall surface, and having a lower acceptor concentration than the second layer, wherein the gate insulating film is interposed between the channel layer and the gate electrode.

2. The nitride semiconductor device according to claim 1, wherein the channel layer is formed by converting the second layer.

3. The nitride semiconductor device according to claim 1, wherein the channel layer is formed by regrowing the group III nitride semiconductor from the second layer.

4. The nitride semiconductor device according to claim 1, further comprising:
a fourth layer formed by a group III nitride semiconductor layer interposed between the second layer and the third layer for preventing introduction of a p-type impurity from the second layer into the third layer.

5. The nitride semiconductor device according to claim 4, wherein the fourth layer is made of AlGaN or AlN.

6. A nitride semiconductor device comprising:
an n-type first layer made of a group III nitride semiconductor;
a p-type second layer made of a group III nitride semiconductor with a p-type impurity content of not less than $1\times10^{18}$ cm$^{-3}$ provided on the first layer;
an n-type third layer made of a group III nitride semiconductor with a p-type impurity content of not more than $1\times10^{18}$ cm$^{-3}$ provided on the second layer, wherein a group III nitride semiconductor multilayer structure includes the first layer, the second layer and the third layer;
a wall surface extending over the first layer, the second layer and the third layer;
a gate insulating film formed such that the gate insulating film is opposed to the wall surface;
a gate electrode formed such that the gate electrode is opposed to the second layer through the gate insulating film;
a drain electrode formed such that the drain electrode is in ohmic contact with the first layer;
a source electrode formed such that the source electrode is in ohmic contact with the third layer; and
a channel layer, different in conductivity from the second layer, formed on a semiconductor surface portion of the second layer on the wall surface, and having a lower acceptor concentration than the second layer, wherein the gate insulating film is interposed between the channel layer and the gate electrode,
wherein a portion of the channel layer having the lower acceptor concentration than the second layer extends between the n-type first layer and the n-type third layer.

7. The nitride semiconductor device according to claim 4, wherein the third layer is formed above the second layer.

8. The nitride semiconductor device according to claim 1, wherein the p-type impurity content of the p-type second layer is $1\times10^{18}$ cm$^{-3}$ to $5\times10^{19}$ cm$^{-3}$.

* * * * *